US012068053B2

United States Patent
Takekida

(10) Patent No.: US 12,068,053 B2
(45) Date of Patent: Aug. 20, 2024

(54) SEMICONDUCTOR DEVICE

(71) Applicant: KIOXIA CORPORATION, Tokyo (JP)

(72) Inventor: Hideto Takekida, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 61 days.

(21) Appl. No.: 17/903,889

(22) Filed: Sep. 6, 2022

(65) Prior Publication Data

US 2023/0197117 A1  Jun. 22, 2023

(30) Foreign Application Priority Data

Dec. 16, 2021 (JP) ................. 2021-204117

(51) Int. Cl.
  *G11C 5/06* (2006.01)
  *G11C 16/08* (2006.01)
(52) U.S. Cl.
  CPC ............. *G11C 5/06* (2013.01); *G11C 16/08* (2013.01)
(58) Field of Classification Search
  CPC .. G11C 5/06; G11C 16/08; G11C 7/10; G11C 16/10; G11C 16/26; G11C 7/08; G11C 16/0483; G11C 2207/2245; G11C 7/062; G11C 7/067; G11C 8/12; H01L 28/10; H10B 41/40; H10B 43/40
  See application file for complete search history.

(56) References Cited

U.S. PATENT DOCUMENTS

| 8,391,040 B2 | 3/2013 | Suzuki et al. |
| 8,744,349 B2 | 6/2014 | Kuroda |
| 8,921,976 B2 | 12/2014 | Zhang et al. |
| 10,283,493 B1 | 5/2019 | Nishida |

(Continued)

FOREIGN PATENT DOCUMENTS

| JP | 2018-152419 A | 9/2018 |
| TW | 201921636 A | 6/2019 |

(Continued)

OTHER PUBLICATIONS

M. Saito et al., "2 Gb/s 15 pJ/b/chip Inductive-Coupling Programmable Bus for NAND Flash Memory Stacking" IEEE Journal of Solid-State Circuits, vol. 45, No. 1, Jan. 2010, pp. 134-141.

(Continued)

*Primary Examiner* — Xiaochun L Chen
(74) *Attorney, Agent, or Firm* — Kim & Stewart LLP

(57) ABSTRACT

A semiconductor device includes a substrate, a first external connection pad separated from the substrate in a first direction, which is a thickness direction thereof, a first coil separated from the substrate in the first direction and electrically connected to the connection pad, a first stacked body between the connection pad and the substrate and between the first coil and the substrate, the first stacked body including a first insulator, a first wiring therein, and a first pad electrically connected to the wiring, and a second stacked body between the first stacked body and the substrate, the second stacked body including a second insulator, a second wiring therein, a second pad electrically connected to the second wiring, and a second coil. The first insulator contacts the second insulator. The first pad contacts the second pad. A part of the first coil overlaps the second coil in the first direction.

20 Claims, 16 Drawing Sheets

(56) References Cited

U.S. PATENT DOCUMENTS

| | | |
|---|---|---|
| 2016/0027732 A1 | 1/2016 | Igarashi et al. |
| 2018/0261623 A1 | 9/2018 | Higashi et al. |
| 2019/0043836 A1 | 2/2019 | Fastow et al. |
| 2019/0164905 A1 | 5/2019 | Hsieh et al. |
| 2019/0189327 A1 | 6/2019 | Kim et al. |
| 2019/0363067 A1* | 11/2019 | Kuroda ................ H01L 23/645 |
| 2020/0279841 A1 | 9/2020 | Sanuki |
| 2021/0082877 A1 | 3/2021 | Uchiyama |
| 2021/0082897 A1 | 3/2021 | Okada et al. |
| 2021/0159158 A1 | 5/2021 | Chen et al. |

FOREIGN PATENT DOCUMENTS

| | | |
|---|---|---|
| TW | 201931394 A | 8/2019 |
| TW | 201933062 A | 8/2019 |
| TW | 201933558 A | 8/2019 |
| TW | 202123785 A | 6/2021 |

OTHER PUBLICATIONS

M. Saito et al., "47% Power Reduction and 91% Area Reduction in Inductive-Coupling Programmable Bus for NAND Flash Memory Stacking" IEEE 2009 Custom Integrated Circuits Conference (CICC), 2009, pp. 449-452.

* cited by examiner

SEMICONDUCTOR DEVICE

CROSS-REFERENCE TO RELATED APPLICATION (S)

This application is based upon and claims the benefit of priority from Japanese Patent Application No. 2021-204117, filed Dec. 16, 2021, the entire contents of which are incorporated herein by reference.

FIELD

Embodiments described herein relate generally to a semiconductor device.

BACKGROUND

Semiconductor devices including an inductor element have been known.

DETAILED DESCRIPTION

Figure 1:
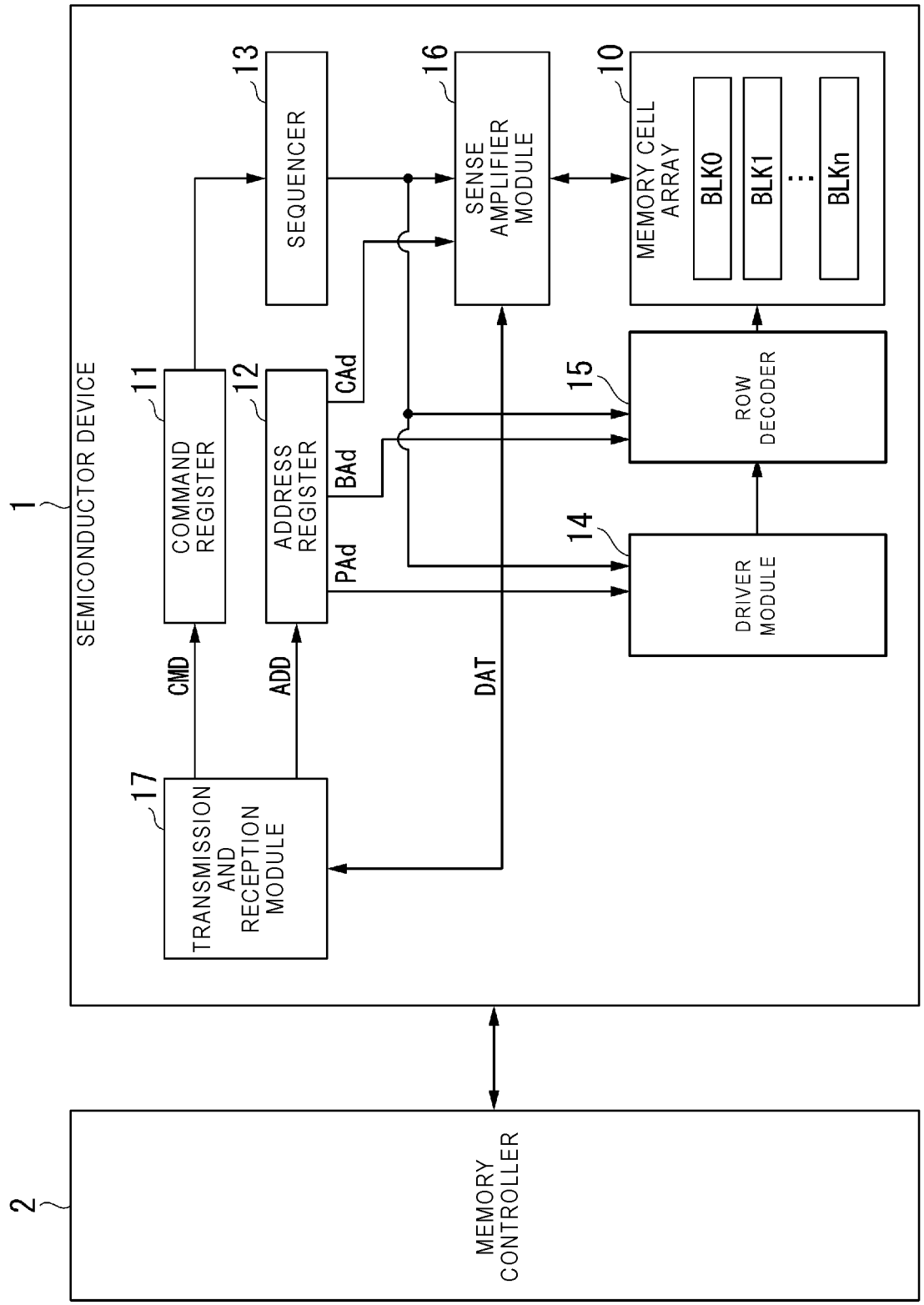
FIG. 1 is a block diagram of a memory system including a semiconductor device according to a first embodiment.

Embodiments provide a semiconductor device for improving electrical characteristics.

In general, according to one embodiment, a semiconductor device includes a substrate, a first external connection pad separated from the substrate in a first direction, which is a thickness direction of the substrate, a first coil separated from the substrate in the first direction and electrically connected to the first external connection pad, a first stacked body between the first external connection pad and the substrate and between the first coil and the substrate, the first stacked body including a first insulator, a first wiring in the first insulator, and a first pad electrically connected to the first wiring, and a second stacked body between the first stacked body and the substrate, the second stacked body including a second insulator, a second wiring in the second insulator, a second pad electrically connected to the second wiring, and a second coil. The first insulator is in contact with the second insulator. The first pad is in contact with the second pad. At least a part of the first coil overlaps the second coil in the first direction.

Hereinafter, semiconductor devices according to certain example embodiments will be described with reference to the drawings. In the following description, elements having the same or substantially similar functions are denoted by the same reference numerals. Duplicate descriptions of those elements may be omitted. The term "connection" is not limited to "physical connection," and may mean "electrical connection." That is, a connection between certain members does not necessarily require direct contact between such members, and another member may be present in between the "connected" elements. The terms "orthogonal" and "identical" include cases of "substantially orthogonal" and "substantially identical", respectively.

First Embodiment

<1. Overall Configuration of Semiconductor Device>

FIG. 1 is a block diagram of a memory system including a semiconductor device 1 according to a first embodiment. As the semiconductor device 1, a NAND flash memory is used in this example. The semiconductor device 1 is controlled by a memory controller 2. Communications between the semiconductor device 1 and the memory controller 2 are performed according to, for example, a NAND interface standard.

As shown in FIG. 1, the semiconductor device 1 includes a memory cell array 10, a command register 11, an address register 12, a sequencer 13, a driver module 14, a row decoder 15, a sense amplifier module 16, and a transmission and reception module 17.

The memory cell array 10 includes a plurality of blocks BLK0 to BLKn (n is an integer of 1 or more). Each block BLK includes a plurality of memory cells capable of storing data non-volatilely and can be used as a data erasing unit. The memory cell array 10 includes a plurality of bit lines and a plurality of word lines. Each memory cell is associated with one bit line and one word line.

The command register 11 stores a command CMD received by the semiconductor device 1 from the memory controller 2 via the transmission and reception module 17. The command CMD may be a command for causing the sequencer 13 to execute a read operation, a write operation, an erase operation, or the like.

The address register 12 stores address information ADD received by the semiconductor device 1 from the memory controller 2 via the transmission and reception module 17. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls overall operations of the semiconductor device 1. For example, the sequencer 13 controls the driver module 14, the row decoder 15, the sense amplifier module 16, or the like based on the command CMD stored in the command register 11 to execute the read operation, the write operation, the erase operation, or the like.

The driver module 14 generates a voltage to be used in the read operation, the write operation, the erase operation, and the like. For example, based on the page address PAd stored in the address register 12, the driver module 14 applies the generated voltage to a signal line corresponding to the selected word line.

The row decoder 15 selects one corresponding block in the memory cell array 10 based on the block address BAd stored in the address register 12. For example, the row decoder 15 applies the voltage applied to the signal line corresponding to the selected word line, to the selected word line in the selected block.

The sense amplifier module 16 applies, in the write operation, a desired voltage to each bit line according to written data DAT received from the memory controller 2 via the transmission and reception module 17. The sense amplifier module 16 determines, in the read operation, data stored in the memory cell based on a voltage of the bit line or a current flowing through the bit line, and transfers a determination result as read data DAT to the memory controller 2 via the transmission and reception module 17.

The transmission and reception module 17 sends a signal sent from the memory controller 2 to the command register 11 and the address register 12 in the semiconductor device 1, and sends a signal output from the sense amplifier module 16 to the memory controller 2.

The semiconductor device 1 and the memory controller 2 described above may be combined into one semiconductor device. Examples of such a semiconductor device include a solid state drive (SSD).

(Row Decoder)

Next, a configuration of the row decoder 15 of the semiconductor device 1 according to the first embodiment will be described with reference to FIG. 2.

Figure 2:
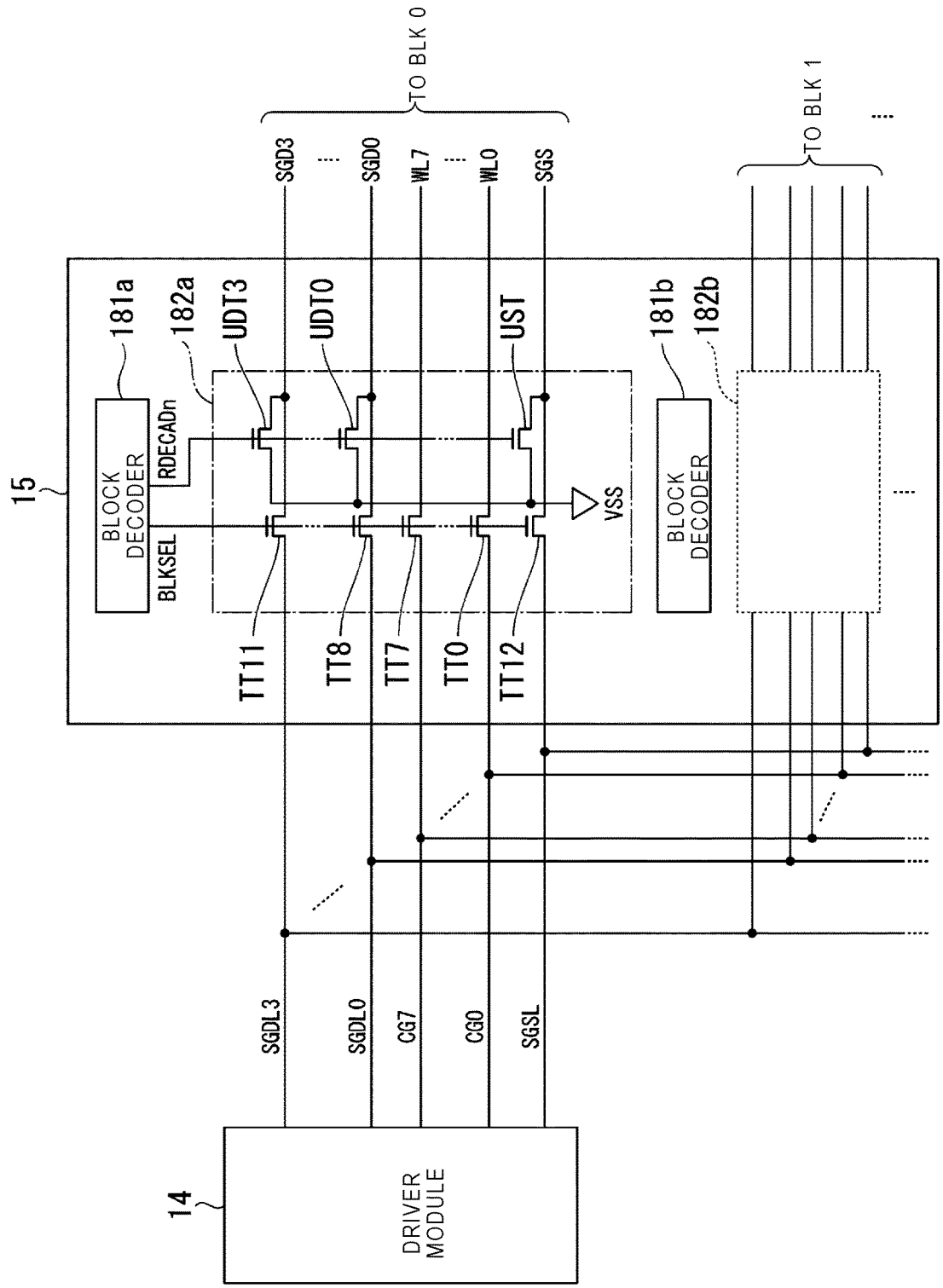
FIG. 2 is a circuit diagram of a row decoder in a semiconductor device according to a first embodiment.

As shown in FIG. 2, the row decoder 15 includes a plurality of block decoders 181 (181a, 181b, . . . ) and a plurality of transfer switch groups 182 (182a, 182b, . . . ). Each of the transfer switch groups 182 includes transistors TT0 to TT12, UDT0 to UDT3, and UST.

One block decoder 181 and one transfer switch group 182 are assigned to one block BLK. In the example in FIG. 2, the block decoder 181a and the transfer switch group 182a are assigned to the block BLK0, and the block decoder 181b and the transfer switch group 182b are assigned to the block BLK1. In the following description, a block BLK to be written, read, and erased is referred to as a selected block BLK.

The block decoder 181 decodes a block address signal received from the address register 12 when data is written, read, or erased. When the block decoder 181 determines, as a result of decoding, that the block BLK corresponding to the block decoder 181 is the selected block BLK, the block decoder 181 outputs a signal BLKSEL with a "H" level and a signal RDECADn with an "L" level. Further, when the block decoder 181 determines that the corresponding block BLK is not the selected block BLK, the block decoder 181 outputs a signal BLKSEL with an "L" level and a signal RDECADn with an "H" level. The signal BLKSEL is a voltage that turns the transistors TT0 to TT12 on at the "H" level, and turns the transistors TT0 to TT12 off at the "L" level. The signal RDECADn is a voltage that turns the transistors UDT0 to UDT3 and UST on at the "H" level and turns the transistors UDT0 to UDT3 and UST off at the "L" level.

The transistors TT0 to TT7 are used to apply voltages to word lines WL0 to WL7 of the selected block BLK, respectively. First terminals of the transistors TT0 to TT7 are connected to the word lines WL0 to WL7 of the corresponding block BLK, respectively, second terminals thereof are connected to signal lines CG0 to CG7, respectively, and gates thereof are commonly connected to the signal line BLKSEL.

The transistors TT8 to TT11 and UDT0 to UDT3 are used to apply voltages to select gate lines SGD0 to SGD3 of the selected block BLK, respectively. First terminals of the transistors TT8 to TT11 are connected to the select gate lines SGD0 to SGD3 of the corresponding block BLK, respectively, second terminals thereof are connected to signal lines SGDL0 to SGDL3, respectively, and gates thereof are commonly connected to the signal line BLKSEL. First terminals of the transistors UDT0 to UDT3 are connected to the select gate lines SGD0 to SGD3 of the corresponding block BLK, the second terminals thereof may be grounded to a ground voltage VSS, and gates thereof are commonly connected to the signal line RDECADn.

The transistors TT12 and UST are used to apply voltages to a select gate line SGS of the selected block BLK. A first terminal of the transistor TT12 is connected to the select gate line SGS of the corresponding block BLK, a second terminal thereof is connected to a signal line SGSL, and a gate thereof is connected to the signal line BLKSEL. A first terminal of the transistor UST is connected to the select gate line SGS of the corresponding block BLK, a second terminal thereof may be grounded to the ground voltage VSS, and a gate thereof is connected to the signal line RDECADn.

Thus, in the transfer switch group 182 corresponding to the selected block BLK, the transistors TT0 to TT12 are turned on, and the transistors UDT0 to UDT3 and the transistor UST are turned off. Accordingly, the word lines WL0 to WL7 are connected to the signal lines CG0 to CG7, respectively, the select gate lines SGD0 to SGD3 are connected to the signal lines SGDL0 to SGDL3, respectively, and the select gate line SGS is connected to the signal line SGSL.

On the other hand, in the transfer switch group 182 corresponding to a non-selected block BLK, the transistors TT0 to TT12 are turned off, and the transistors UDT0 to UDT3 and the transistor UST are turned on. Accordingly, the word lines WL are disconnected from the signal lines CG0 to CG7, the select gate lines SGD0 to SGD3 are disconnected from the signal lines SGDL0 to SGDL3, and the select gate line SGS is disconnected from the signal line SGSL.

The driver module 14 applies voltages to the signal lines CG, SGDL, and SGSL according to an address received from the address register 12. Through the signal lines CG, SGDL, and SGSL, the various voltages are applied from the driver module 14 to the transfer switch groups 182a, 182b, . . . . That is, the voltages applied from the driver module 14 are applied to the word lines WL in the selected block BLK, and the select gate lines SGD and SGS via the transistors TT0 to TT12 in the transfer switch group 182 corresponding to the selected block BLK.

The row decoder 15 in the semiconductor device 1 according to the first embodiment is described above. However, the row decoder 15 is not limited to the circuit configuration described above as long as the voltages applied to the signal lines corresponding to the selected word lines can be applied to the selected word lines in the selected block.

(Sense Amplifier Module)

Figure 3:
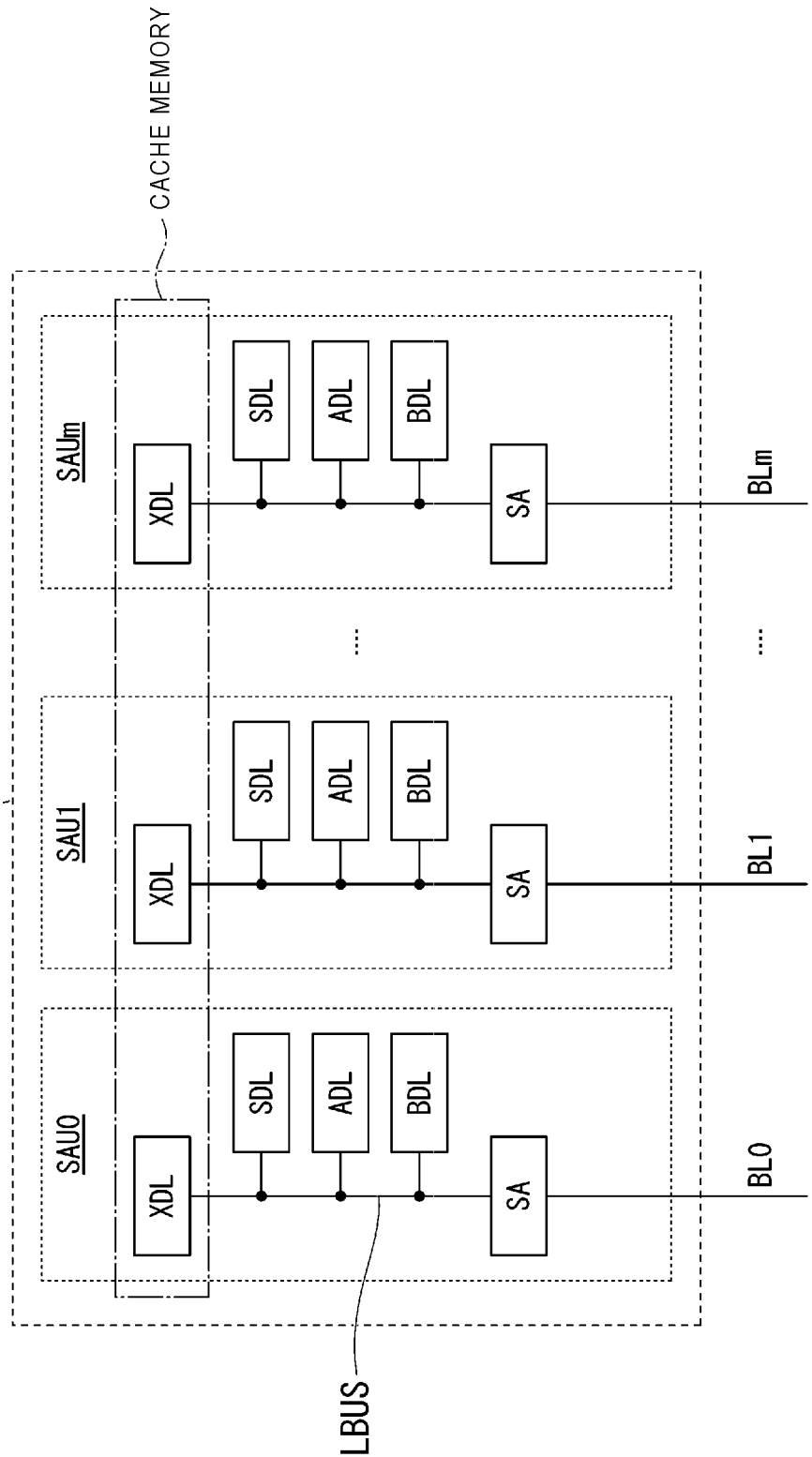
FIG. 3 is a block diagram of a sense amplifier module in a semiconductor device according to a first embodiment.

FIG. 3 is an example of a circuit configuration of the sense amplifier module 16 in the semiconductor device 1 according to the first embodiment. As shown in FIG. 3, the sense amplifier module 16 includes sense amplifier units SAU0 to SAUm. The sense amplifier units SAU0 to SAUm are associated with bit lines BL0 to BLm, respectively. Each sense amplifier unit SAU includes, for example, a sense amplifier portion SA, a bus LBUS, and latch circuits SDL, ADL, BDL and XDL.

The sense amplifier portion SA determines in a read operation, whether the read data is "0" or "1" based on a voltage of the associated bit line BL or a current flowing to the associated bit line BL. In other words, the sense amplifier portion SA detects the data as read from the associated bit line BL, and determines the data that was stored in a selected memory cell. The latch circuits SDL, ADL, BDL and XDL temporarily store the read data, written data, and the like.

The sense amplifier portion SA and the latch circuits SDL, ADL, BDL and XDL can be connected to the bus LBUS, and transmit and receive data to each other via the bus LBUS. The latch circuit XDL is connected to an input and output circuit or the like and is used to input and output data between the sense amplifier units SAU and the input and output circuit. The latch circuit XDL may be used, for example, as a cache memory of the semiconductor device 1. For example, even though the latch circuits SDL, ADL and BDL are in use, the semiconductor device 1 can be ready when the latch circuit XDL is not in use.

Figure 4:
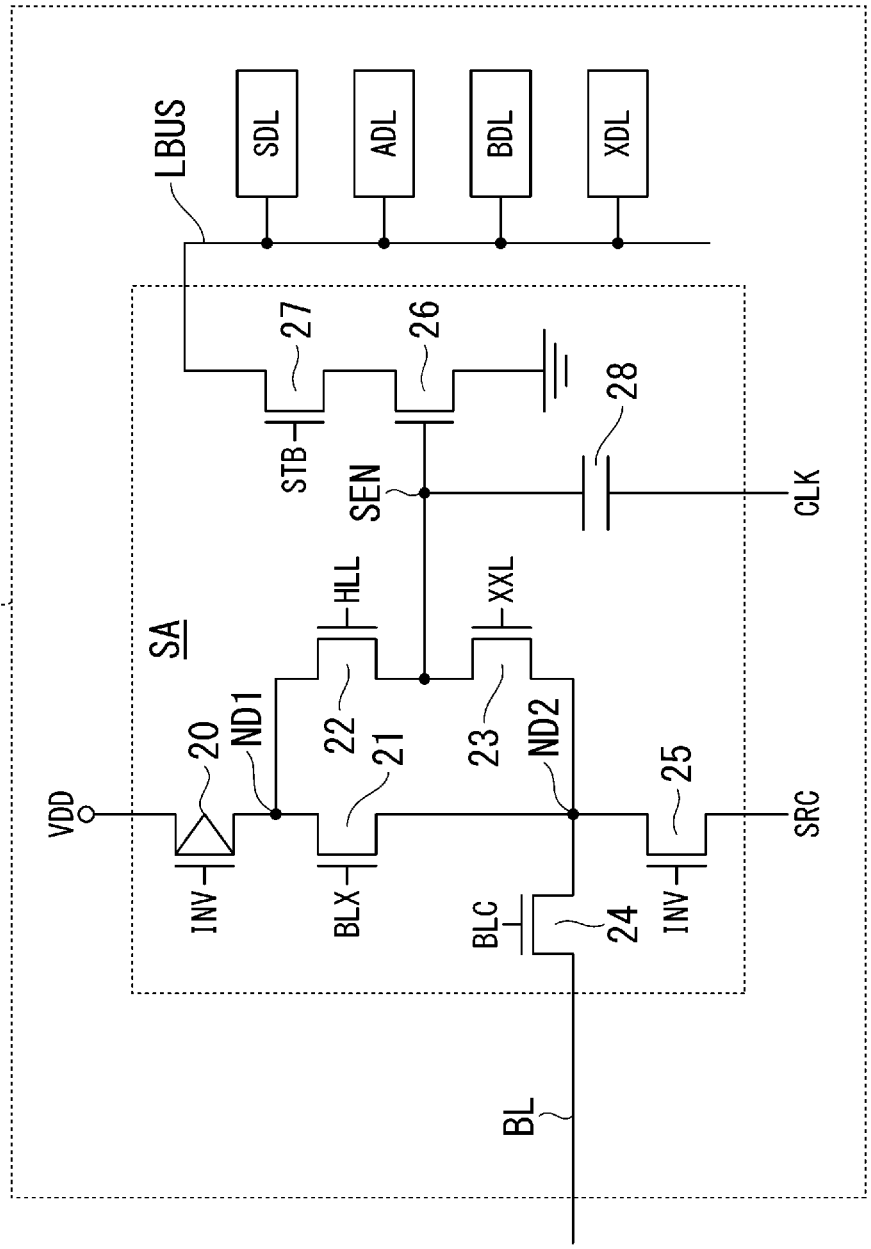
FIG. 4 is a circuit diagram of a sense amplifier module in a semiconductor device according to a first embodiment.

FIG. 4 shows an example of a circuit configuration of the sense amplifier unit SAU in the semiconductor device 1 according to the first embodiment. As shown in FIG. 4, for example, the sense amplifier portion SA includes transistors 20 to 27 and a capacitor 28.

The transistor 20 is a P-type MOS transistor. The transistors 21 to 23, and 25 to 27 are all N-type MOS transistors. The transistor 24 is an N-type MOS transistor with a higher withstand voltage (breakdown voltage) than the transistors 21 to 23 and 25 to 27. The transistors 21 to 23 and 25 to 27 can be referred to as transistors with a low withstand voltage and the transistor 24 can be referred to as a transistor with a high withstand voltage.

A source of the transistor 20 may be connected to a power supply line. A drain of the transistor 20 is connected to a node ND1. A gate of the transistor 20 is connected to a node INV in the latch circuit SDL. A drain of the transistor 21 is connected to the node ND1. A source of the transistor 21 is connected to a node ND2. A control signal BLX is input to a gate of the transistor 21. A drain of the transistor 22 is connected to the node ND1. A source of the transistor 22 is connected to a node SEN. A control signal HLL is input to a gate of the transistor 22.

A drain of the transistor 23 is connected to the node SEN. A source of the transistor 23 is connected to the node ND2. A control signal XXL is input to a gate of the transistor 23. A drain of the transistor 24 is connected to the node ND2. A control signal BLC is input to a gate of the transistor 24. A source of the transistor 24 is connected to the bit line BL. A drain of the transistor 25 is connected to the node ND2. A source of the transistor 25 is connected to a node SRC. A gate of the transistor 25 is connected to the node INV in the latch circuit SDL.

A source of the transistor 26 may be grounded. A gate of the transistor 26 is connected to the node SEN. A drain of the transistor 27 is connected to the bus LBUS. A source of the transistor 27 is connected to a drain of the transistor 26. A control signal STB is input to a gate of the transistor 27. One electrode of the capacitor 28 is connected to the node SEN. A clock CLK is input to the other electrode of the capacitor 28.

In the circuit configuration of the sense amplifier unit SAU described above, a power supply voltage VDD can be applied to the power supply line connected to the source of the transistor 20. For example, the ground voltage VSS can be applied to the node SRC. The control signals BLX, HLL, XXL, BLC, STB, and BLS, as well as the clock CLK are generated by, for example, the sequencer 13. The sense amplifier portion SA determines the data read from the bit line BL based on, for example, a timing when the control signal STB is turned on.

The sense amplifier module 16 in the semiconductor device 1 according to the first embodiment is not limited to the circuit configuration described above. For example, the number of the latch circuits in each sense amplifier unit SAU may be appropriately changed based on the number of pages stored in one memory cell. The sense amplifier portion SA may be another circuit configuration as long as it is possible to determine the data read from the bit line BL.

(Transmission and Reception Module)

Figure 5:
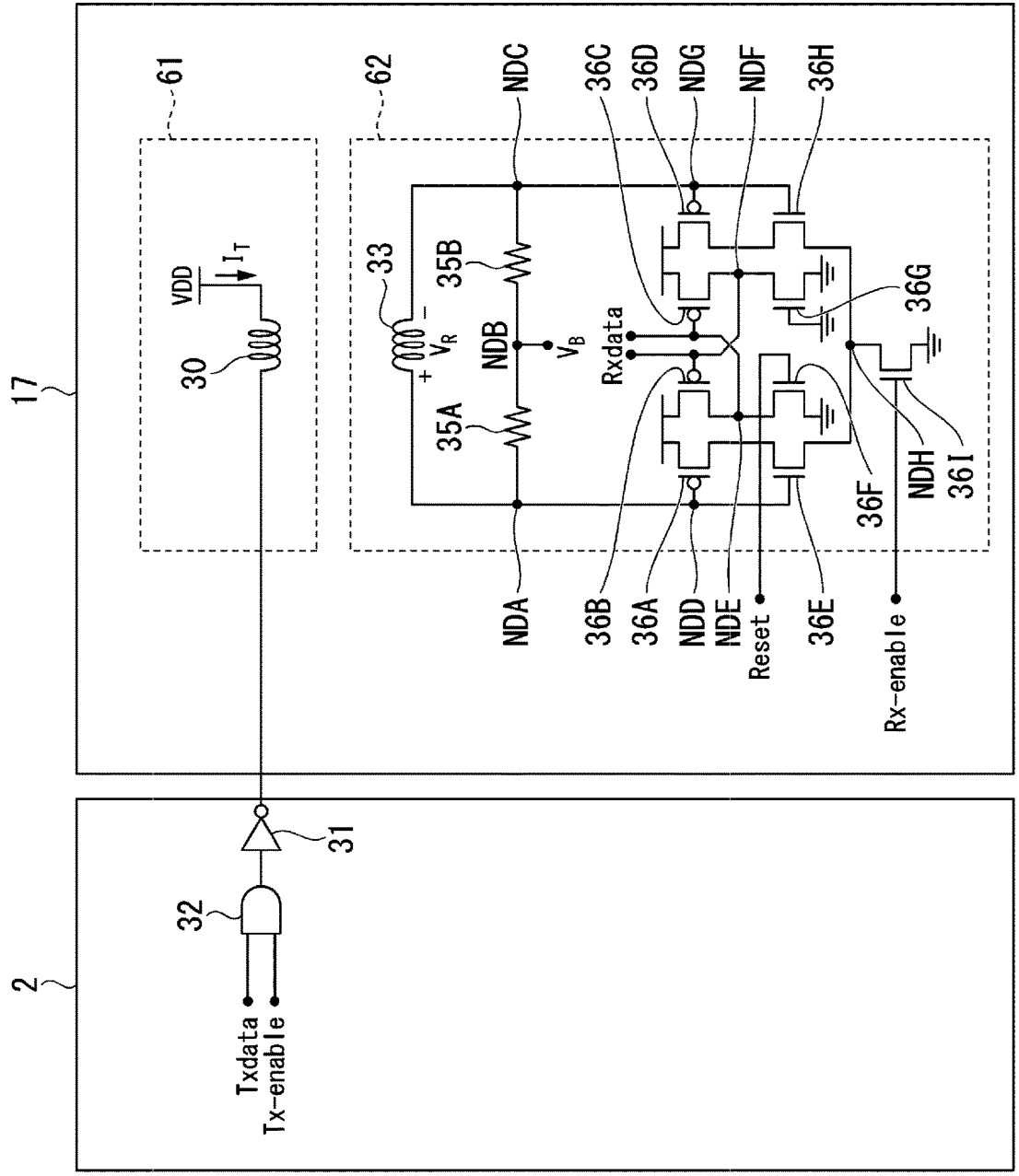
FIG. 5 is a circuit diagram of a transmission and reception module in a semiconductor device and a memory controller according to a first embodiment.

FIG. 5 is an example of a part of a circuit configuration of the transmission and reception module 17 in the semiconductor device 1 and the memory controller 2 according to the first embodiment. The transmission and reception module 17 includes, for example, a transmission circuit 61 and a reception circuit 62.

The transmission circuit 61 includes, for example, a first coil 30. The first coil 30 is connected to an inverter 31 disposed outside the semiconductor device 1. Further, the power supply voltage VDD can be applied to the first coil 30. The inverter 31 is connected to an AND gate 32 disposed outside the semiconductor device 1. In the present embodiment, the inverter 31 and the AND gate 32 are disposed inside the memory controller 2. For example, a signal Txdata and a signal Tx-enable are input to the AND gate 32. For example, a CMOS inverter is used as the inverter 31.

The reception circuit 62 includes, for example, a second coil 33, resistors 35A and 35B, and transistors 36A to 36I. For example, a hysteresis comparator circuit is used as the reception circuit 62. The transistors 36A to 36D are P-type MOS transistors. The transistors 36E to 36I are N-type MOS transistors.

The resistor 35A is connected to nodes NDA and NDB. The resistor 35B is connected to nodes NDB and NDC. A voltage VB can be applied to the node NDB. A source of the transistor 36A is connected to the power supply line. A drain of the transistor 36A is connected to a drain of the transistor 36E. A gate of the transistor 36A is connected to a node NDD. A source of the transistor 36B is connected to the power supply line. A drain of the transistor 36B is connected to a node NDE. A gate of the transistor 36B is connected to a node NDF.

A source of the transistor 36C is connected to the power supply line. A drain of the transistor C is connected to the node NDF. A gate of the transistor 36C is connected to the node NDE. A source of the transistor 36D is connected to the power supply line. A drain of the transistor 36D is connected to a drain of the transistor 36H. A gate of the transistor 36D is connected to a node NDG.

A drain of the transistor 36E is connected to the drain of the transistor 36A. A source of the transistor 36E is connected to a node NDH. A gate of the transistor 36E is connected to the node NDD. A drain of the transistor 36F is connected to the node NDE. The ground voltage VSS can be applied to a source of the transistor 36F. A signal Reset is input to a gate of the transistor 36F.

A drain of the transistor 36G is connected to the node NDF. The ground voltage VSS can be applied to a source of the transistor 36G. The ground voltage VSS can be applied to a gate of the transistor 36G. The drain of the transistor 36H is connected to the drain of the transistor 36D. A source of the transistor 36H is connected to the node NDH. A gate of the transistor 36H is connected to the node NDG.

A drain of the transistor 36I is connected to the node NDH. The ground voltage VSS can be applied to a source of the transistor 36I. A signal Rx-enable is input to a gate of the transistor 36I.

A case where a signal is transmitted from the transmission circuit 61 to the reception circuit 62 will be described. The transmission circuit 61 is controlled by the signal Tx-enable. For example, when the signal Tx-enable is High, the transmission circuit 61 is turned on, and a transmission current Ir flows through the first coil 30 in the transmission circuit 61. Accordingly, upon receipt of the input signal Txdata, inductive coupling between the first coil 30 in the transmission circuit 61 and the second coil 33 in the reception circuit 62 generates a pulse-type reception voltage VR on both ends of the second coil 33. The reception circuit 62 has, for example, a hysteresis width $V_H$ for distinguishing data from noise. The reception circuit 62 is controlled by the signal Rx-enable. When the signal Rx-enable is "H", the reception circuit 62 is turned on. When an amplitude of the reception voltage VR is larger than an amplitude of the hysteresis width $V_H$, the reception circuit 62 transits a reception signal Rxdata and restores the input signal Txdata. In order to align the polarity of hysteresis, the signal Reset is input each time the reception circuit 62 is turned on by the signal Rx-enable. Here, the example of transmitting an input signal from the transmission circuit 61 to the reception circuit 62 is described. Alternatively, an output signal may be transmitted from the reception circuit 62 to the transmission circuit 61. Further, examples of the signal transmitted from the transmission circuit 61 to the reception circuit 62 include a data signal, a control signal, and a data strobe signal.

The transmission and reception module 17 in the semiconductor device 1 according to the first embodiment is described above. Alternatively, the transmission and reception module 17 is not limited to the circuit configuration described above as long as the transmission and reception module 17 can transfer a signal from the first coil 30 to the second coil 33.

(Structure of Semiconductor Device)

Figure 6:
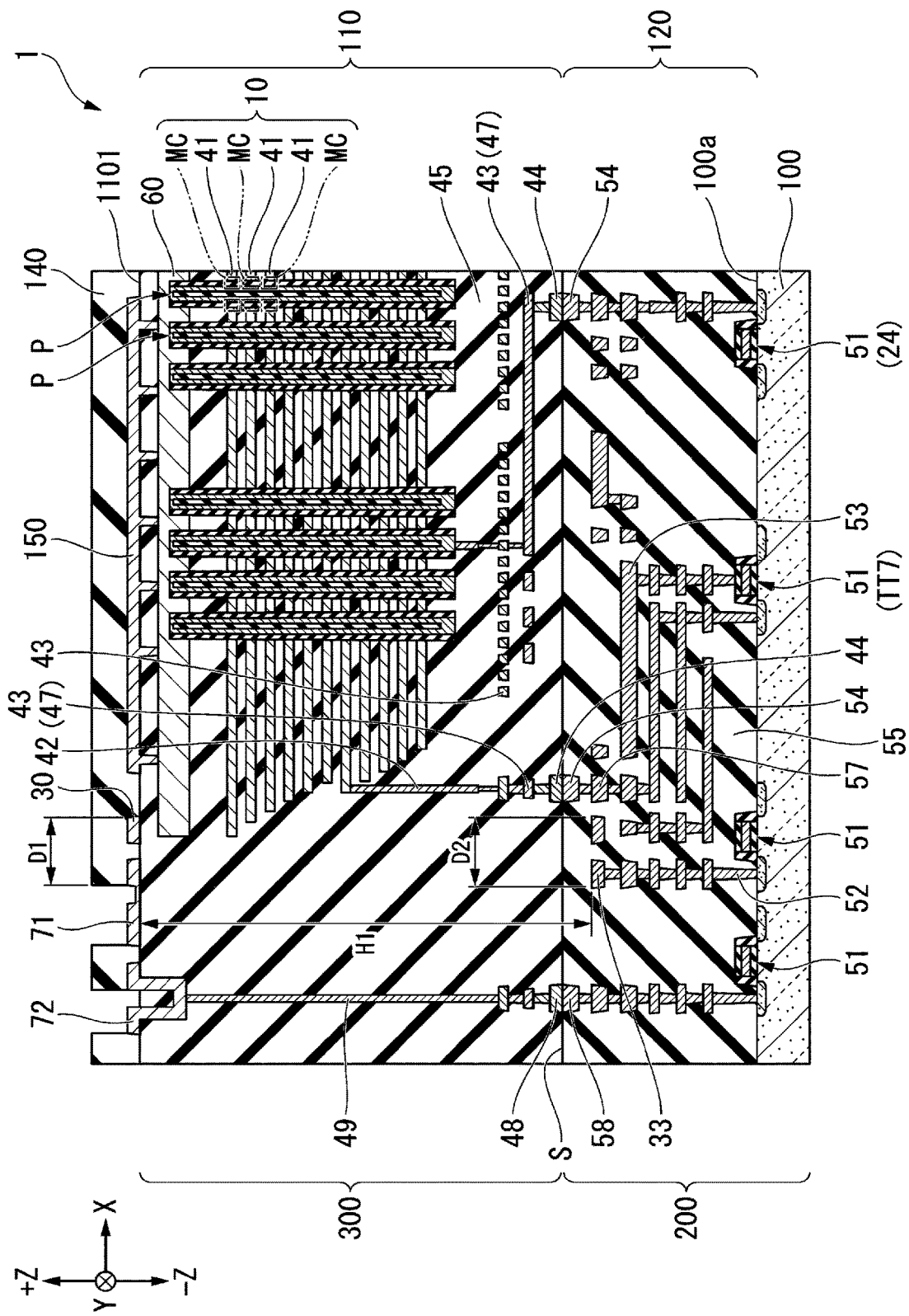
FIG. 6 is a cross-sectional view of a semiconductor device according to a first embodiment.

FIG. 6 is a cross-sectional view showing a configuration of the semiconductor device 1 according to a first embodiment. As the semiconductor device 1, for example, a three-dimensional memory in which a circuit chip 200 and an array chip 300 are bonded to each other along a bonded surface S is used. The circuit chip 200 includes a control circuit or a logic circuit that controls the operation of the array chip 300.

First, an X direction, a Y direction, a +Z direction, and a −Z direction are defined. The X direction and the Y direction are directions along a surface 100a of a first substrate 100 described later (see FIG. 6). The Y direction is a direction intersecting (for example, orthogonal to) the X direction. The +Z direction and the −Z direction are directions intersecting (for example, orthogonal to) the X direction and the Y direction, and correspond to a thickness direction of the first substrate 100. The +Z direction is a direction from the first substrate 100 toward a stacked body 110 (see FIG. 6). The −Z direction is a direction opposite to the +Z direction. When the +Z direction and the −Z direction are not being distinguished from each other, the +Z direction and the −Z direction are simply referred to as the "Z direction". In the following description, the "+Z direction" may be referred to as "upper direction" and the "−Z direction" may be referred to as "lower direction". It is noted that these expressions are for the sake of convenience, and do not necessarily define a direction with respect to gravity. The Z direction is also referred to as the "first direction" in some instances.

The semiconductor device 1 includes a first substrate 100, a first external connection pad 71, a second external connection pad 72, the first coil 30, a wiring 150, the stacked body 110, a stacked body 120, and an insulating layer 140. The first substrate 100, the stacked body 120, the stacked body 110, and the insulating layer 140 are stacked in this order from the lower side to the upper side. In the first embodiment, the first external connection pad 71, the second external connection pad 72, the first coil 30, and the wiring 150 are disposed on a first surface 110l, which is an upper surface of the stacked body 110.

The first external connection pad 71 is provided separated (spaced) from the first substrate 100 in the Z direction, which is the thickness direction of the first substrate 100. The first external connection pad 71 may be an input pad, an output pad, or an input and output pad. The second external connection pad 72 is provided separated (spaced) from the first substrate 100 in the Z direction. The second external connection pad 72 is a pad different from the first external connection pad 71. The first external connection pad 71 and the second external connection pad 72 are not connected to each other. Power from an external power supply can be supplied or a reference voltage (for example, a ground voltage) can be applied to the second external connection pad 72.

The first coil 30 is provided separated from the first substrate 100 in the Z direction. Further, the first coil 30 is connected to the first external connection pad 71. The wiring 150 is electrically connected to a source line 60. The first external connection pad 71, the second external connection pad 72, the first coil 30, and the wiring 150 are each formed by using a conductive material such as copper (Cu), tungsten (W) or aluminum (Al). The first coil 30 will be described later. The first external connection pad 71 and the second external connection pad 72 include or connected to external connection terminals (for example, solder balls), and can be electrically connected to the outside of the semiconductor device 1 via the external connection terminals. A signal that can be input to the first coil 30 via the first external connection pad 71 is at least one of a data signal, a control signal, and a data strobe signal.

The data signal can be a signal indicating data to be written and stored in the memory cell array, a signal indicating data to be read from the memory cell array, a signal indicating various commands, or a signal indicating an address to which data is to be written or from which data is to be read.

The control signal can be a chip enable signal, a write enable signal, a read enable signal, a write protect signal, or a ready/busy signal. The chip enable signal is a signal that enables selection of a particular semiconductor device 1 to be accessed from a plurality of semiconductor devices 1. The write enable signal is a signal that enables data (for example, a command CMD or an address ADD) to be passed to the semiconductor device 1. The read enable signal is a signal that enables data to be read from the semiconductor device 1. The write protect signal is a signal asserted during prohibition of write and erase. The ready/busy signal is a signal that distinguishes whether the semiconductor device 1 is ready or busy.

The data strobe signal is a data strobe signal used for latching a data signal or outputting a data signal.

The first substrate 100 is in the circuit chip 200. The first substrate 100 can be a semiconductor substrate formed of silicon or the like. The first substrate 100 includes the surface 100a on which the stacked body 120 is stacked. The first substrate 100 includes a source region and a drain region of a transistor in the stacked body 120.

The stacked body 110 is provided on the stacked body 120. The stacked body 110 is provided between the first external connection pad 71 and the first substrate 100, between the second external connection pad 72 and the first substrate 100, as well as between the first coil 30 and the first substrate 100. In the present embodiment, the array chip 300 includes the stacked body 110. The stacked body 110 includes the memory cell array 10, a plurality of contact plugs 42, a plurality of wirings 43, a plurality of pads 44, an insulator 45, a first power supply pad 48, and a first power supply wiring 49. The stacked body 110 is also referred to as the "first stacked body".

The memory cell array 10 is provided under the source line 60. The memory cell array 10 includes a plurality of conductive layers 41 and a plurality of memory pillars P. The plurality of conductive layers 41 and the plurality of memory pillars P are connected to the contact plugs 42. The plurality of memory pillars P are also connected to the source line 60.

The plurality of conductive layers 41 are formed by using, for example, tungsten (W) or polysilicon (Poly-Si) doped with impurities. The plurality of conductive layers 1 are stacked in the Z direction while sandwiching interlayer insulating films 45b (see FIG. 7) in the insulator 45. Among the plurality of conductive layers 41, the conductive layers 41 on the stacked body 120 side (−Z direction side), which are four conductive layers 41 on the stacked body 120 side in the present embodiment, function as select gate lines SGD on the drain side. Among the plurality of conductive layers 41, the conductive layer 41 on the source line 60 side (+Z direction side), which is one conductive layer 41 on the source line 60 side in the present embodiment, functions as a select gate line SGS on the source side. At least some of the remaining conductive layers 41 of the plurality of conductive layers 41 positioned between the select gate lines SGD on the drain side and the select gate line SGS on the source side function as the plurality of word lines WL.

Each of the plurality of memory pillars P extends in the Z direction and penetrates the select gate lines SGD on the drain side, the plurality of word lines WL, and the select gate line SGS on the source side. Memory cells MC are formed at the intersection portions between the plurality of word lines WL and the plurality of memory pillars P. Accordingly, the plurality of memory cells MC are three-dimensionally arranged at intervals in the X direction, the Y direction, and the Z direction. The memory cells MC will be described in detail later.

The contact plugs 42, the wirings 43, and the pads 44 electrically connect the memory cell array 10 to the stacked body 120. The contact plugs 42, the wirings 43, and the pads 44 are each formed by a conductive material such as copper, tungsten, or aluminum. Each of the contact plugs 42 extends in the Z direction and is a wiring that electrically connects different layers in the stacked body 110. Each of the wirings 43 is a wiring extending in the X direction or the Y direction.

The pads 44 are connection electrodes provided in the stacked body 110. In a state where the stacked body 110 is stacked on the stacked body 120, the pads 44 of the stacked body 110 are provided on pads 54 of the stacked body 120 and are joined to the pads 54 of the stacked body 120. The pads 44 are also referred to as the "first pads". Wirings 47 connected to the pads 44 among the plurality of wirings 43 are also referred to as "first wirings".

The insulator 45 is provided between the plurality of contact plugs 42, the plurality of wirings 43, and the plurality of pads 44, and electrically insulates the plurality of contact plugs 42, the plurality of wirings 43, and the plurality of pads 44 from each other. That is, the plurality of contact plugs 42, the plurality of wirings 43, and the plurality of pads 44 are provided in the insulator 45. The insulator 45 is formed by using, for example, silicon and oxygen (ex. silicon oxide) or silicon and nitrogen (ex. Silicon nitride). The insulator 45 is also referred to as the "first insulator".

The source line 60 is, for example, a two-layer film including a lower layer portion comprising tungsten (W) and an upper layer portion comprising silicon (Si). The source line 60 is disposed in a region where the memory cell array 10 is positioned, and is not arranged in a region where the first coil 30 and the first power supply wiring are positioned. A voltage may be applied to each portion of the source line 60 from the stacked body 120. The source line 60 is connected to the wiring 150.

The first power supply wiring 49 extending in the insulator 45 in the Z direction connects the second external connection pad 72 to the first power supply pad 48. The first power supply pad 48 is joined to a second power supply pad 58. Accordingly, a power supply voltage, a reference voltage, or the like can be applied to the stacked body 120 via the second external connection pad 72.

The stacked body 120 is positioned between the first substrate 100 and the stacked body 110 in the Z direction. The stacked body 120 is provided on the first substrate 100. In the present embodiment, the circuit chip 200 includes the first substrate 100 and the stacked body 120. The stacked body 120 includes the second coil 33, a plurality of transistors 51, a plurality of contact plugs 52, a plurality of wirings 53, the plurality of pads 54, the second power supply pad 58, and an insulator 55. The second coil 33 is connected to the wirings 53. The stacked body 120 is also referred to as the "second stacked body".

The transistors 51 are provided on the first substrate 100. The transistors 51 are connected to the contact plugs 52. The transistors 51 are electrically connected to the memory cell array 10 and the second external connection pad 72 via the contact plugs 42, 52, the wirings 43, 53, the pads 44, 54, the first power supply pad 48, and the second power supply pad 58. The transistors 51 control, for example, the memory cell array 10. In FIG. 6, the transistor TT7 of the row decoder 15 is connected to one of the plurality of pads 54. Similarly, the transistor 24 of the sense amplifier module 16 is connected to one of the plurality of pads 54.

The contact plugs 52, the wirings 53, and the pads 54 electrically connect the plurality of transistors 51 to the stacked body 110. The second coil 33, the contact plugs 52, the wirings 53, and the pads 54 are each formed by a conductive material such as copper, tungsten, or aluminum. Each of the contact plugs 52 extends in the Z direction and is a wiring for electrically connecting different layers in the stacked body 120. Each of the wirings 53 extends in the X direction or the Y direction.

The pads 54 are connection electrodes provided in the stacked body 120. In a state where the stacked body 110 is stacked on the stacked body 120, the pads 54 of the stacked body 120 are in contact with the pads 44 of the stacked body 110 respectively. The pads 54 are also referred to as the "second pads". Wirings 57 connected to the pads 54 among the plurality of wirings 53 are also referred to as "second wirings".

The insulator 55 is provided between the plurality of contact plugs 52, the plurality of wirings 53, and the plurality of pads 54, and electrically insulates the plurality of contact plugs 52, the plurality of wirings 53, and the plurality of pads 54 from each other. That is, the plurality of contact plugs 52, the plurality of wirings 53, and the plurality of pads 54 are provided in the insulator 55. The insulator 55 is formed by, for example, silicon and oxygen (ex. silicon oxide ($SiO_2$)) or silicon and nitrogen (ex. silicon nitride (SiN)). In a state where the stacked body 110 is stacked on the stacked body 120, the insulator 55 of the stacked body 120 is in contact with the insulator 45 of the stacked body 110. The insulator 55 is also referred to as the "second insulator".

The insulating layer 140 is provided on the first coil 30 and the wiring 150. The insulating layer 140 is a passivation film that protects the stacked body 110. As the insulating layer 140, for example, a silicon and oxygen (ex. silicon oxide film) is used.

Figure 7:
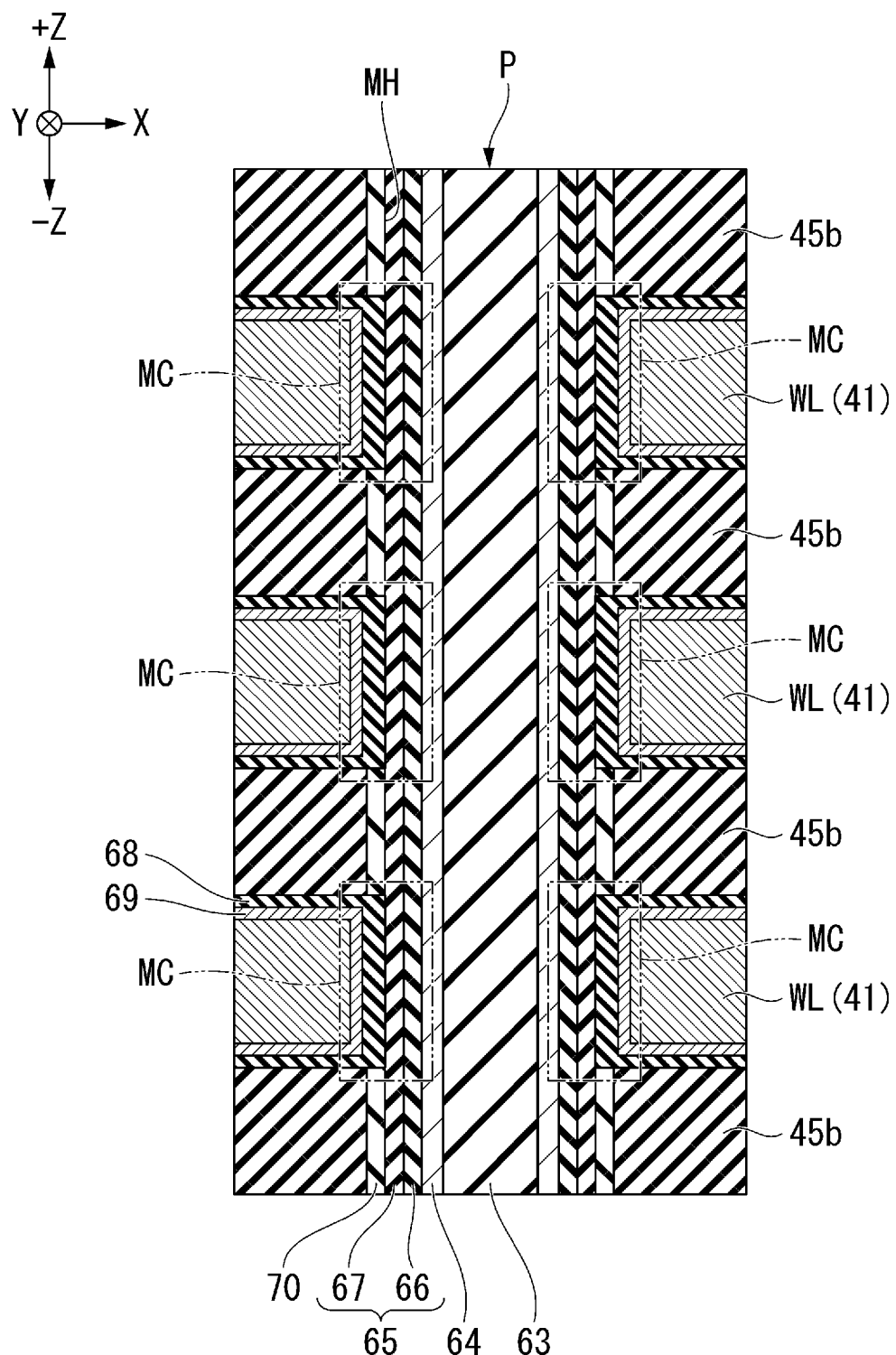
FIG. 7 is a cross-sectional view showing the vicinity of a memory pillar of a memory cell array according to a first embodiment.

FIG. 7 is a cross-sectional view showing the vicinity of the memory pillar P of the memory cell array 10. As shown in FIG. 7, the plurality of word lines WL are stacked in the Z direction while sandwiching the interlayer insulating films 45b. Each of the plurality of word lines WL extends in the X direction. The memory cell array 10 includes a memory hole MH in which a memory pillar P is provided. The memory pillar P extends in the Z direction inside the memory hole MH and penetrates the plurality of word lines WL.

The memory pillar P has, for example, a circular shape or an elliptical shape when viewed from the Z direction. The memory pillar P includes, in order from the inside, a core insulator 63, a semiconductor body 64, and a memory film 65.

The core insulator 63 has a columnar body extending in the Z direction. The core insulator 63 contains, for example, silicon and oxygen (ex. silicon oxide). The core insulator 63 is positioned inside the semiconductor body 64.

The semiconductor body 64 extends in the Z direction and functions as a channel. The semiconductor body 64 is connected to the source line 60. The semiconductor body 64 covers at least a part of an outer peripheral surface of the core insulator 63. The semiconductor body 64 comprises silicon, for example, polysilicon obtained by crystallizing amorphous silicon.

The memory film 65 extends in the Z direction. The memory film 65 covers at least a part of an outer peripheral surface of the semiconductor body 64. The memory film 65 is positioned between an inner surface of the memory hole MH and an outer side surface of the semiconductor body 64. The memory film 65 includes, for example, a tunnel insulating film 66 and a charge storage film 67.

The tunnel insulating film 66 is positioned between the charge storage film 67 and the semiconductor body 64. The tunnel insulating film 66 contains, for example, silicon and oxygen (ex. silicon oxide), or silicon, oxygen and nitrogen (ex. silicon oxide and silicon nitride). The tunnel insulating film 66 is a voltage barrier between the semiconductor body 64 and the charge storage film 67.

The charge storage film 67 is provided between the word line WL and the tunnel insulating film 66, and between the interlayer insulating film 45b and the tunnel insulating film 66. The charge storage film 67 contains, for example, silicon and nitrogen (ex. silicon nitride). An intersection portion between the charge storage film 67 and the word line WL functions as the memory cell MC. The memory cell MC stores data based on the presence or absence of charges or an accumulated charge amount in the intersection portion (charge accumulation portion) between the charge storage film 67 and the word line WL. The charge accumulation portion is disposed between the word line WL and the semiconductor body 64 and is surrounded by an insulating material.

A block insulating film 68 and a barrier film 69 may be provided between the word line WL and the interlayer insulating film 45b and between the word line WL and the memory film 65. The block insulating film 68 prevents back tunneling. The back tunneling is a phenomenon in which charges from the word line WL return to the memory film 65. As the block insulating film 68, for example, a silicon and oxygen (ex. silicon oxide film), a metal and oxygen (ex. metal oxide film), or a stacked structure film in which a plurality of insulating films are stacked is used. One example of the metal oxide is aluminum oxide. The barrier film 69 is, for example, a film including titanium and nitrogen (ex. titanium nitride film) or stacked titanium nitride and titanium films.

A cover insulating film 70 may be provided between the interlayer insulating film 45b and the charge storage film 67. The cover insulating film 70 contains, for example, silicon and oxygen (ex. silicon oxide). The cover insulating film 70 protects the charge storage film 67 from etching during processing. The cover insulating film 70 may be omitted, or may be used as a block insulating film by leaving a part between the conductive layer 41 and the charge storage film 67.

<Structures of First Coil and Second Coil>

Figure 8:
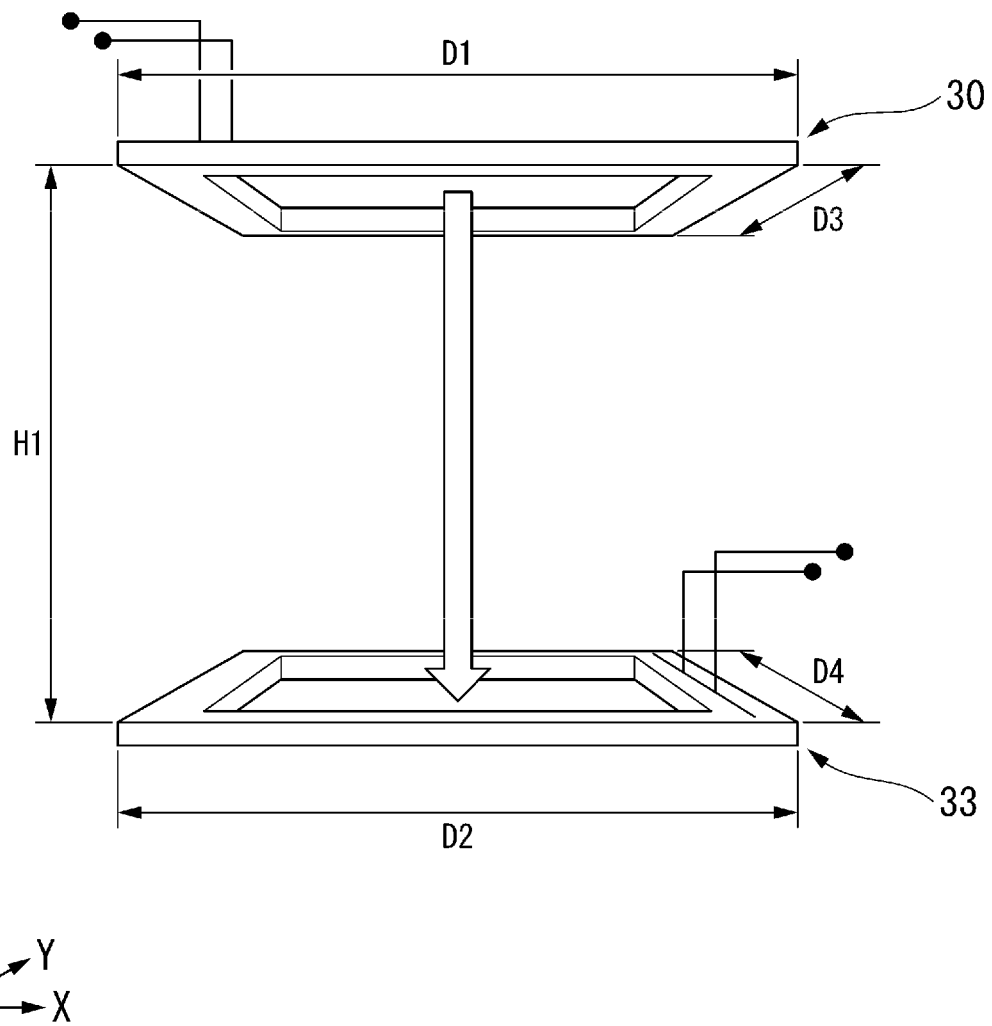
FIG. 8 is a diagram showing a positional relation between a first coil and a second coil according to a first embodiment.

FIG. 8 is a diagram showing a positional relation between the first coil 30 and the second coil 33. At least a part of the first coil 30 overlaps the second coil 33 in the Z direction. The first coil 30 can be inductively coupled to the second coil 33. The positional relation between the first coil 30 and the second coil 33 is not particularly limited as long as the first coil 30 and the second coil 33 can be inductively coupled to each other. The shape of the first coil 30 can be a quadrangular frame shape or an annular shape. The shape of the second coil 33 can be a quadrangular frame shape or an annular shape. The shape of the first coil 30 and the shape of the second coil 33 are preferably the same. In the first embodiment, the second coil 33 is on the first substrate 100 side with respect to the bonded surface S between the pad 44 and the pad 54 in the Z direction.

A length D1 of the first coil 30 in the X direction is not particularly limited. Similarly, a length D3 of the first coil 30 in the Y direction is not particularly limited. The length D3 of the first coil 30 in the Y direction is preferably equal to the length D1 of the first coil 30 in the X direction. The length D1 of the first coil 30 in the X direction is preferably longer than a distance H1 in the Z direction between the first coil 30 and the second coil 33. The length D3 of the first coil 30 in the Y direction is preferably longer than the distance H1 in the Z direction between the first coil 30 and the second coil 33.

A length D2 of the second coil 33 in the X direction is not particularly limited. Similarly, a length D4 of the second coil 33 in the Y direction is not particularly limited. The length D4 of the second coil 33 in the Y direction is preferably equal to the length D2 of the second coil 33 in the X direction. The length D2 of the second coil 33 in the X direction is preferably longer than the distance H1 in the Z direction between the first coil 30 and the second coil 33. The length D4 of the second coil 33 in the Y direction is preferably longer than the distance H1 in the Z direction between the first coil 30 and the second coil 33.

The first embodiment is described above. The semiconductor device 1 can be produced by a known manufacturing method. In the semiconductor device 1 according to the first embodiment, power saving can be achieved by transmitting a signal between the first coil 30 and the second coil 33 by using inductive coupling. Since the wiring used for transmitting data signals and the like can be omitted, design restrictions on arrangement of the external connection pads are reduced. Accordingly, the size of the semiconductor device 1 can be reduced.

Second Embodiment

Next, a semiconductor device 1B according to a second embodiment of the present disclosure will be described with reference to FIG. 9. In this second embodiment, the same parts as the components in the first embodiment are designated by the same reference numerals, the description thereof will be omitted, and only the differences will be described.

Figure 9:
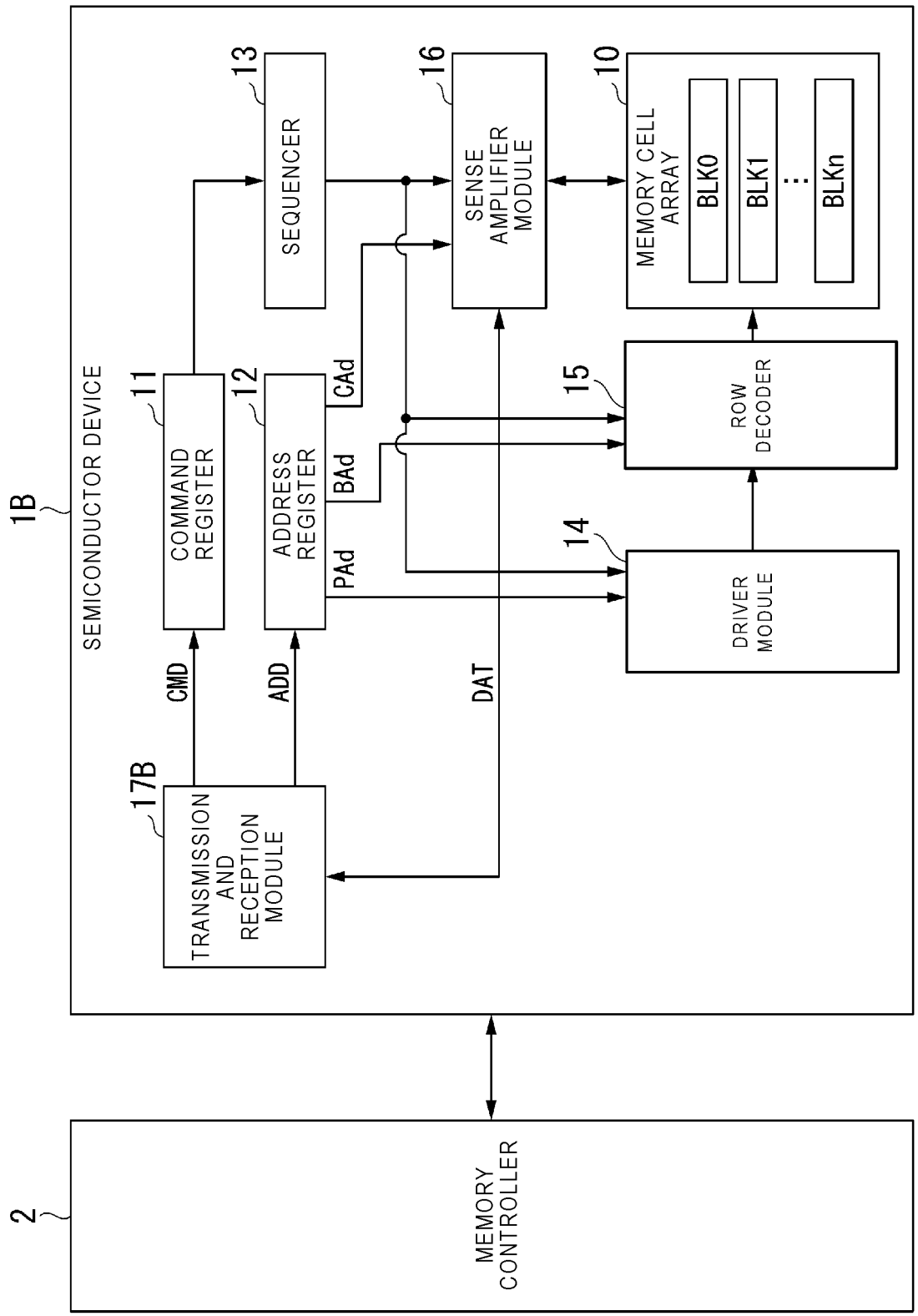
FIG. 9 is a block diagram of a memory system including a semiconductor device according to a second embodiment.

FIG. 9 is a block diagram of a memory system including the semiconductor device 1B according to the second embodiment. As the semiconductor device 1B, for example, a NAND flash memory is used. The semiconductor device 1B is controlled by the memory controller 2. Communications between the semiconductor device 1B and the memory controller 2 are performed according to, for example, a NAND interface standard.

As shown in FIG. 9, for example, the semiconductor device 1B includes the memory cell array 10, the command register 11, the address register 12, the sequencer 13, the driver module 14, the row decoder 15, the sense amplifier module 16, and a transmission and reception module 17B.

The transmission and reception module 17B sends a signal sent from the memory controller 2 to the command register 11 and the address register 12 in the semiconductor device 1B, and sends a signal output from the sense amplifier module 16 to the memory controller 2.

(Transmission and Reception Module)

Figure 10:
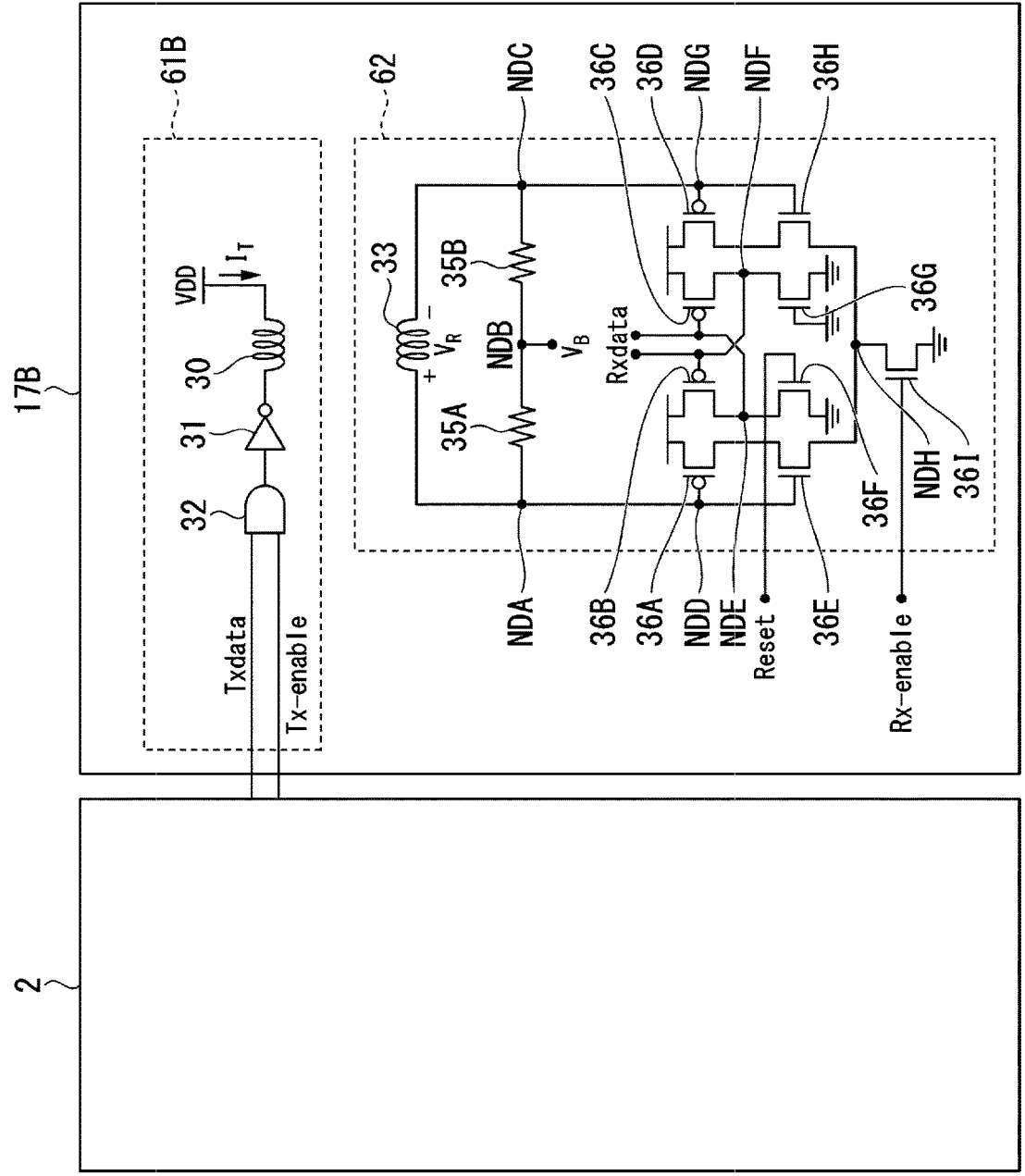
FIG. 10 is a circuit diagram of a transmission and reception module in a semiconductor device and a memory controller according to a second embodiment.

FIG. 10 is an example of a part of a circuit configuration of the transmission and reception module 17B in the semiconductor device 1B and the memory controller 2 according to the second embodiment. The transmission and reception module 17B includes, for example, a transmission circuit 61B and the reception circuit 62.

The transmission circuit 61B includes, for example, the first coil 30, the inverter 31, and the AND gate 32. The first coil 30 is connected to the inverter 31 of the transmission and reception module 17B. The power supply voltage VDD is applied to the first coil 30. The inverter 31 is connected to the AND gate 32. For example, the signals Txdata and Tx-enable are input to the AND gate 32 from the memory controller 2.

(Structure of Semiconductor Device)

Figure 11:
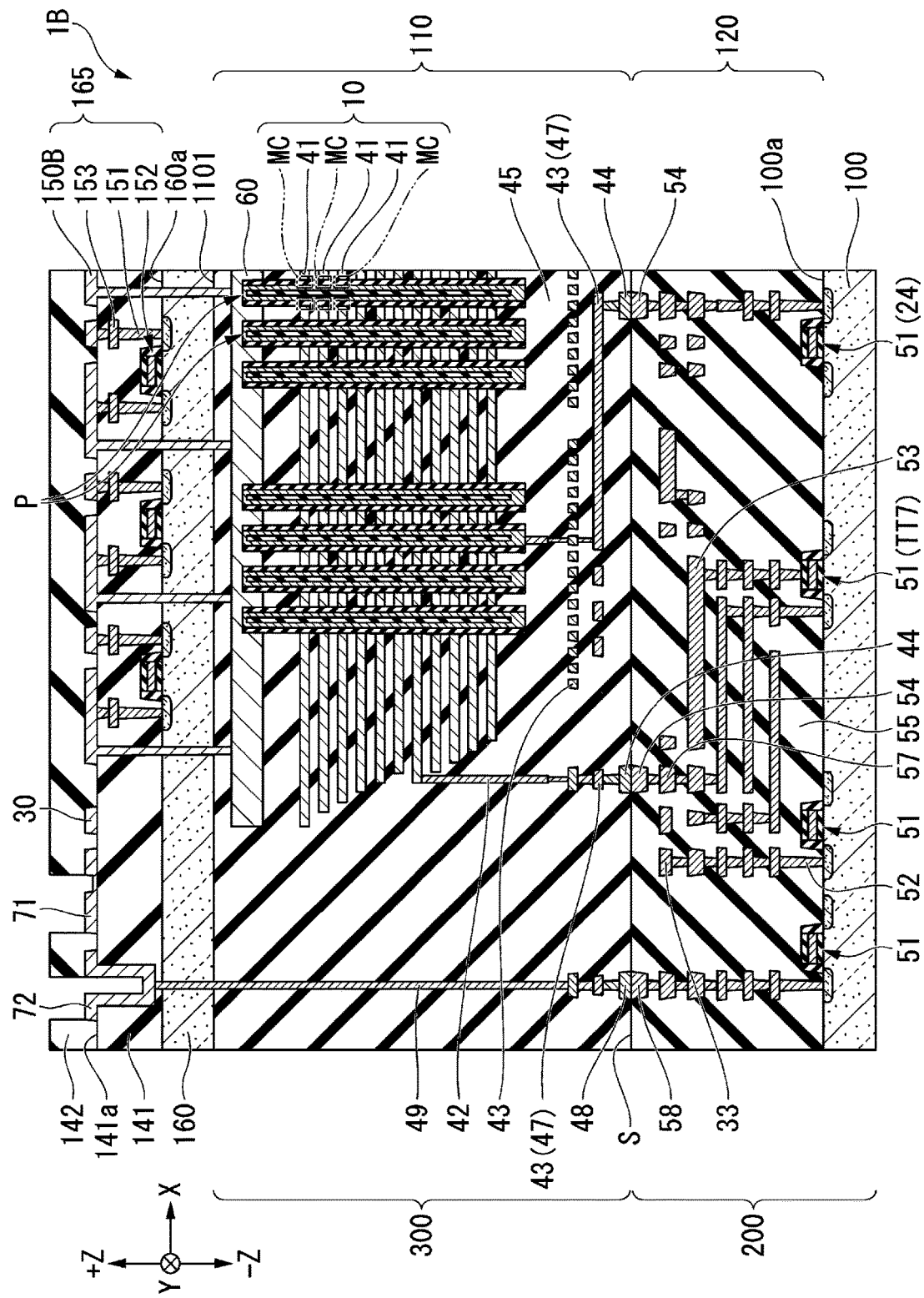
FIG. 11 is a cross-sectional view of a semiconductor device according to a second embodiment.

FIG. 11 is a cross-sectional view showing a configuration of the semiconductor device 1B according to a second embodiment. The semiconductor device 1B is a three-dimensional memory in which the circuit chip 200 and the array chip 300 are bonded to each other along the bonded surface S. The circuit chip 200 includes a control circuit or a logic circuit that controls the operation of the array chip 300.

The semiconductor device 1B includes, for example, the first substrate 100, the first external connection pad 71, the second external connection pad 72, the first coil 30, the stacked body 110, the stacked body 120, a second substrate 160, and a stacked body 165.

The second substrate 160 is provided on the stacked body 110. The second substrate 160 is provided separated from the first substrate 100 in the Z direction. The second substrate 160 is disposed on the first surface 1101 of the stacked body 110. The second substrate 160 is a semiconductor substrate comprising silicon or the like. The second substrate 160 includes a source region and a drain region of a transistor 152 of the stacked body 165.

The stacked body 165 is disposed on a surface 160a of the second substrate 160. The stacked body 165 includes a plurality of wirings 150B, a plurality of contact plugs 151, a plurality of transistors 152, a plurality of wirings 153, an insulating layer 141, an insulating layer 142, the first external connection pad 71, the second external connection pad 72, and the first coil 30.

The first external connection pad 71 is provided separated from the first substrate 100 in the Z direction, which is the thickness direction of the first substrate 100. The second external connection pad 72 is provided separated from the first substrate 100 in the Z direction. The first coil 30 is provided separated from the first substrate 100 in the Z direction. Further, the first coil 30 is connected to the first external connection pad 71. The wirings 150B are electrically connected to the source line 60 of the stacked body 110. In the second embodiment, the first external connection pad 71, the second external connection pad 72, the first coil 30, and the plurality of wirings 150B are disposed on a first surface 141a of the insulating layer 141. The first external connection pad 71, the second external connection pad 72, the first coil 30, the contact plugs 151, and the wirings 150B are each formed by a conductive material such as copper, tungsten or aluminum. The first external connection pad 71 and the second external connection pad 72 include or connected to external connection terminals (for example, solder balls), and can be electrically connected to the outside of the semiconductor device 1B via the external connection terminals. A signal that can be input to the first coil 30 via the first external connection pad 71 is at least one of a data signal, a control signal, and a data strobe signal.

The transistors 152 are provided on the second substrate 160. The transistors 152 are connected to the contact plugs 151. The transistors 152 are electrically connected to the first coil 30 and the first external connection pad 71 via the contact plugs 151 and the wirings 150B. The plurality of transistors 152 function as the inverter 31 and the AND gate 32. The inverter 31 is provided separated from the first substrate 100 in the Z direction. The inverter 31 is electrically connected between the first external connection pad 71 and the first coil 30.

The insulating layer 141 is provided between the plurality of contact plugs 151 and the plurality of wirings 153, and electrically insulates the plurality of contact plugs 151 and the plurality of wirings 153 from each other. The insulating layer 141 is formed by, for example, silicon and oxygen (ex. silicon oxide) or silicon and nitrogen (ex. silicon nitride).

The insulating layer 142 is provided on the first coil 30 and the wirings 150B. The insulating layer 142 is a passivation film that protects the first coil 30 and the wirings 150B. The insulating layer 142 is, for example, a silicon and oxygen (ex. silicon oxide film).

The second embodiment is described above. The semiconductor device 1B can be produced by a known manufacturing method. In the semiconductor device 1B according to the second embodiment, power saving can be achieved by transmitting a signal between the first coil 30 and the second coil 33 by using inductive coupling. Since the wiring used for transmitting data signals and the like can be omitted, design restrictions on arrangement of the external connection pads are reduced. Accordingly, the size of the semiconductor device 1B can be reduced. Since the semiconductor device 1B includes the inverter and the AND gate on the second substrate, a part of the circuit on the memory controller 2 side can be omitted.

Third Embodiment

Next, a semiconductor device 1C according to a third embodiment of the present disclosure will be described with reference to FIG. 12. In this third embodiment, the same parts as the components in the first embodiment are designated by the same reference numerals, the description thereof will be omitted, and only the differences will be described.
(Structure of Semiconductor Device)

Figure 12:
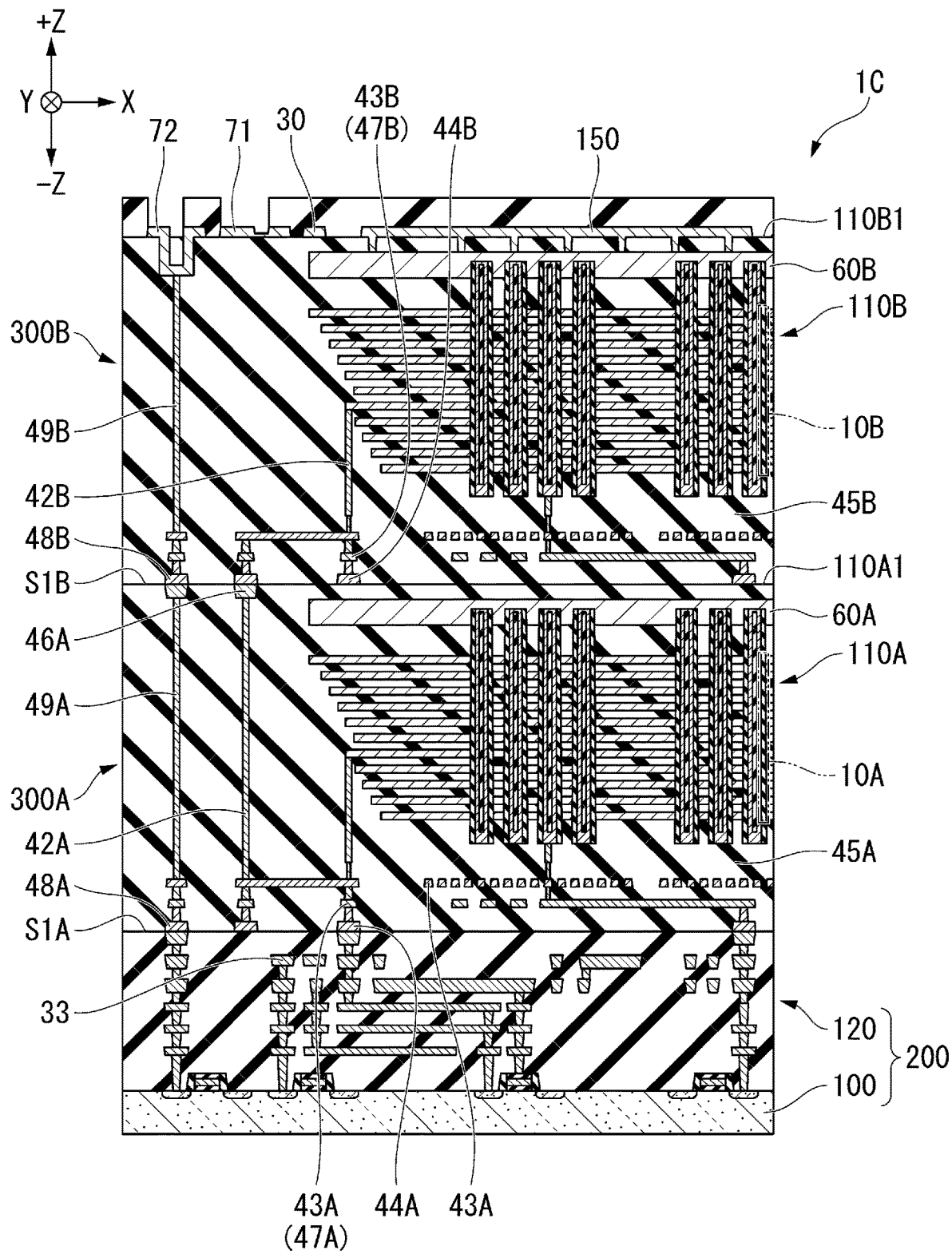
FIG. 12 is a cross-sectional view of a semiconductor device according to a third embodiment.

FIG. 12 is a cross-sectional view showing a configuration of the semiconductor device 1C according to a third embodiment. In the semiconductor device 1C, the circuit chip 200 is bonded to an array chip 300A along a bonded surface S1A. An array chip 300B is bonded to the array chip 300A along a bonded surface S1B. The circuit chip 200 includes a control circuit or a logic circuit that controls operations of the array chips 300A and 300B.

The first external connection pad 71 is provided separated from the first substrate 100 in the Z direction, which is the thickness direction of the first substrate 100. The second external connection pad 72 is provided separated from the first substrate 100 in the Z direction. The second external connection pad 72 is a pad different from the first external connection pad 71. Power from an external power supply can be supplied or a reference voltage (for example, a ground voltage) can be applied to the second external connection pad 72.

The first coil 30 is provided separated from the first substrate 100 in the Z direction. Further, the first coil 30 is connected to the first external connection pad 71. The wiring 150 is electrically connected to source lines 60A and 60B. In the third embodiment, the first external connection pad 71, the second external connection pad 72, the first coil 30, and the wiring 150 are disposed on a first surface 110B1 of a stacked body 110B. The first external connection pad 71, the second external connection pad 72, the first coil 30, and the wiring 150 are each formed of a conductive material such as copper, tungsten or aluminum. The first external connection pad 71 and the second external connection pad 72 include (or connected to) external connection terminals (for example, solder balls), and can thus be electrically connected to the outside of the semiconductor device 1C via these external connection terminals.

The array chip 300A includes a stacked body 110A. The stacked body 110A is provided on the stacked body 120. The stacked body 110A is provided between the first substrate 100 and the stacked body 110B. The stacked body 110A includes a memory cell array 10A, a plurality of contact plugs 42A, a plurality of wirings 43A, a plurality of pads 44A, 46A, an insulator 45A, a first power supply pad 48A, and a first power supply wiring 49A. The stacked body 110A is also referred to as the "first stacked body". The pads 44A are also referred to as the "first pads". The pads 46A are also referred to as the "fourth pads". The insulator 45A is also referred to as the "first insulator". Among the wirings 43A, wirings 47A connected to the pads 44 are also referred to as "first wirings".

The array chip 300B includes the stacked body 110B. The stacked body 110B is provided on the stacked body 110A. The stacked body 110B is provided between the first external connection pad 71, the second external connection pad 72, and the first coil 30, and the stacked body 110A. The stacked body 110B includes a memory cell array 10B, a plurality of contact plugs 42B, a plurality of wirings 43B, a plurality of pads 44B, an insulator 45B, a first power supply pad 48B, and a first power supply wiring 49B. The stacked body 110B is also referred to as the "third stacked body". The pads 44B are also referred to as the "third pads". The insulator 45B is also referred to as the "third insulator". Among the wirings 43B, wirings 47B connected to the pads 44 are also referred to as "third wirings".

The pads 46A are connection electrodes provided in the stacked body 110A. In a state where the stacked body 110B is stacked on the stacked body 110A, the pads 46A of the stacked body 110A are joined to the pads 44B of the stacked body 110B. The insulator 45A is in contact with the insulator 45B.

The embodiment is described above. The semiconductor device 1C can be produced by a known manufacturing method. In the semiconductor device 1C according to the third embodiment, power saving can be achieved by transmitting a signal between the first coil 30 and the second coil 33 by using inductive coupling. Since the wiring used for transmitting data signals and the like can be omitted, design restrictions on arrangement of the external connection pads are reduced. Accordingly, the size of the semiconductor device 1C can be reduced. The semiconductor device 1C includes a plurality of array chips. Thus, the storage capacity can be made larger than that of the semiconductor device 1.

In the third embodiment, one example in which the number of the array chips is two is described. It is noted that the number of the array chips is not limited to two. The number of array chips in the semiconductor device may be two or more.

Fourth Embodiment

Next, a semiconductor device 1D according to a fourth embodiment of the present disclosure will be described with reference to FIG. 13. In this fourth embodiment, the same parts as the components in the first embodiment and the third embodiment are designated by the same reference numerals, the description thereof will be omitted, and only the differences will be described.
(Structure of Semiconductor Device)

Figure 13:
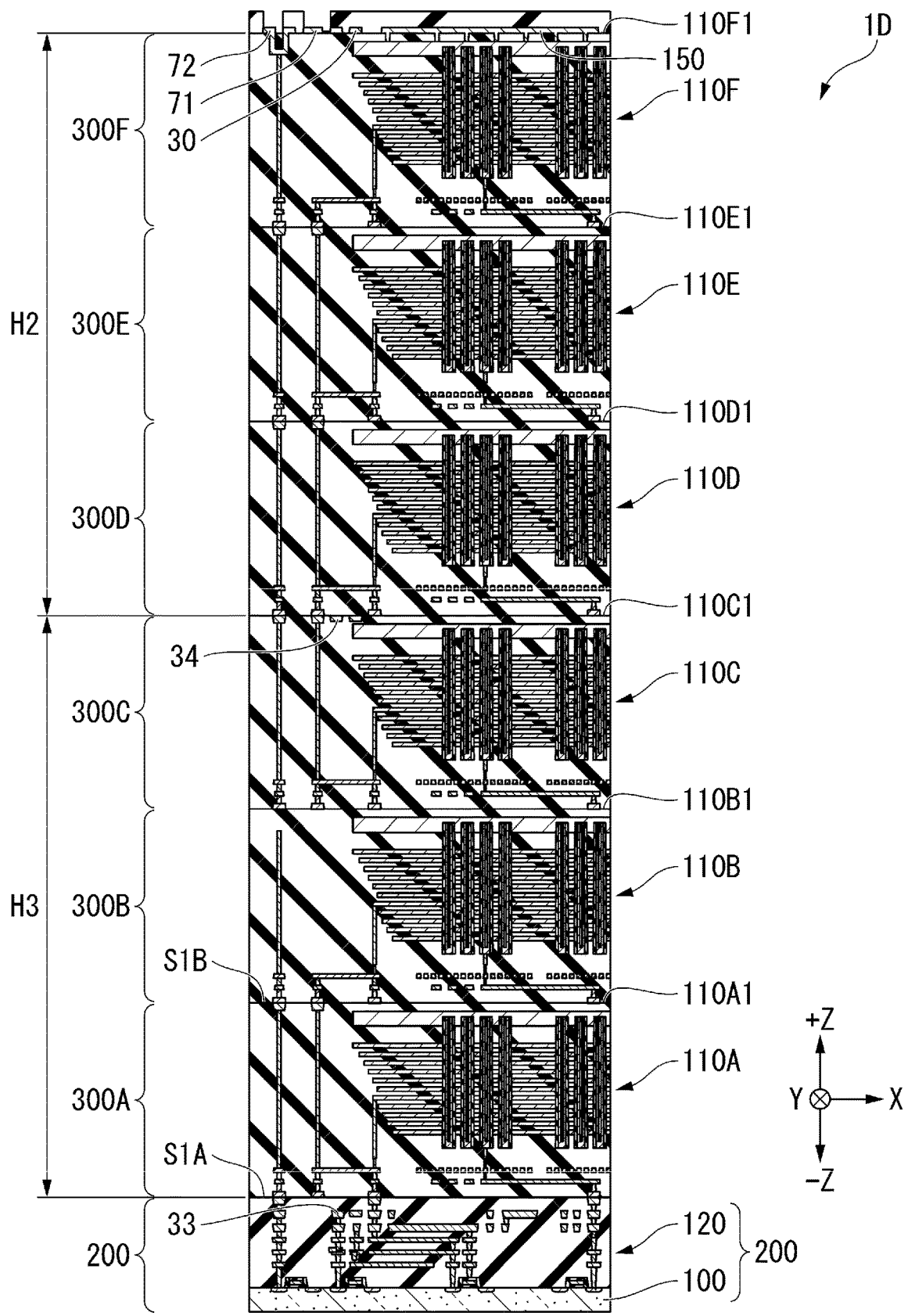
FIG. 13 is a cross-sectional view of a semiconductor device according to a fourth embodiment.

FIG. 13 is a cross-sectional view showing a configuration of the semiconductor device 1D according to a fourth embodiment. In the semiconductor device 1D, the circuit chip 200 is bonded to the array chip 300A along the bonded surface S1A. The array chip 300B is bonded to the array chip 300A along the bonded surface S1B. Similarly, array chips 300C to 300F are bonded to each other. The circuit chip 200 includes a control circuit or a logic circuit that controls operations of the array chips 300A, 300B, 300C, 300D, 300E, and 300F. The semiconductor device 1D includes the first coil 30, the second coil 33, and a third coil 34. The third coil 34 is provided in a stacked body 110C.

The first external connection pad 71 is provided separated from the first substrate 100 in the Z direction, which is the thickness direction of the first substrate 100. The second external connection pad 72 is provided separated from the first substrate 100 in the Z direction. The second external connection pad 72 is a pad different from the first external connection pad 71. Power from an external power supply can be supplied or a reference voltage (for example, a ground voltage) can be applied to the second external connection pad 72. The first coil 30 is provided separated from the first substrate 100 in the Z direction. Further, the first coil 30 is connected to the first external connection pad 71. The wiring 150 is electrically connected to the source line 60. In the fourth embodiment, the first external connection pad 71, the second external connection pad 72, the first coil 30, and the wiring 150 are disposed on a first surface 110F1 of a stacked body 110F.

<Structures of First Coil, Second Coil, and Third Coil>

Figure 14:
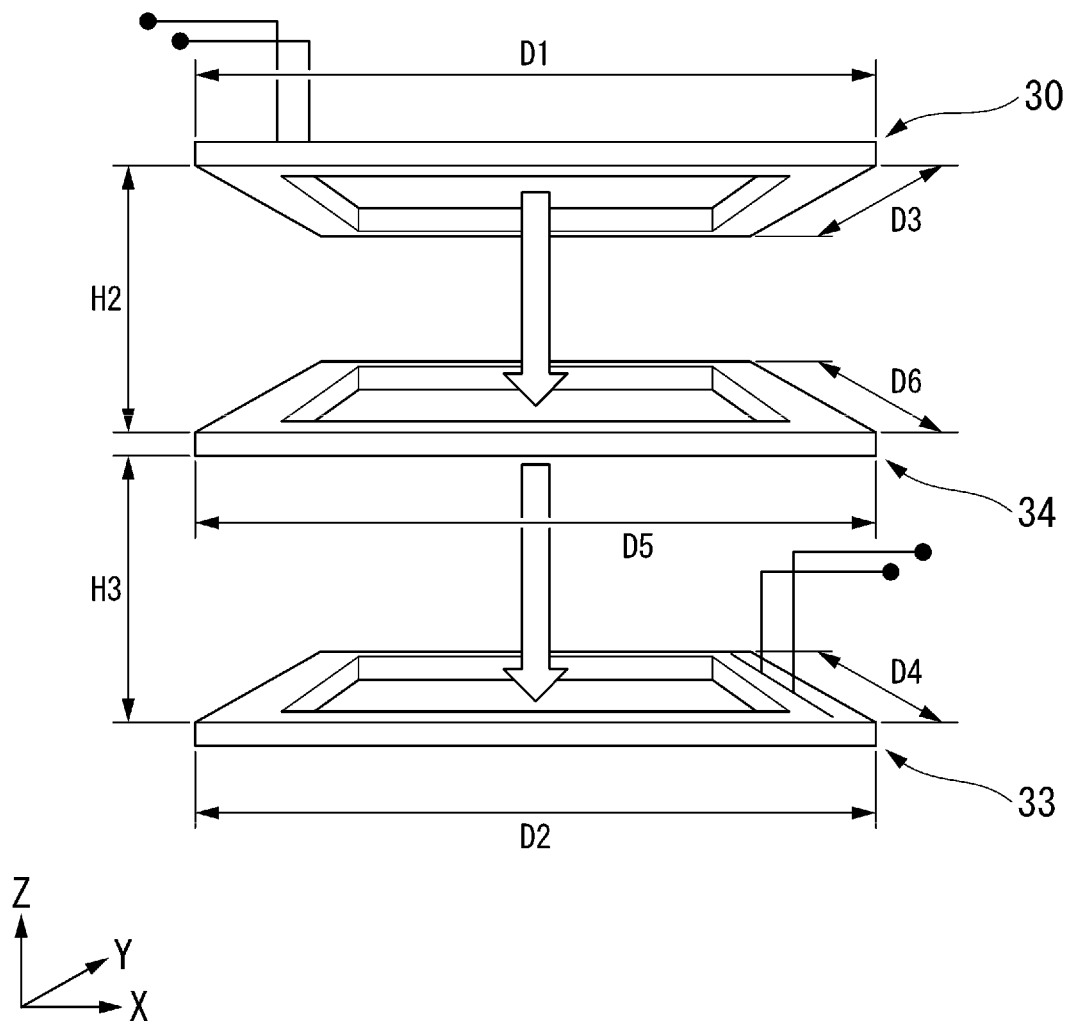
FIG. 14 is a diagram showing a positional relation among a first coil, a second coil, and a third coil according to a fourth embodiment.

FIG. 14 is a diagram showing a positional relation among the first coil 30, the second coil 33, and the third coil 34.

At least a part of the first coil 30 overlaps the third coil 34 in the Z direction. The first coil 30 can be inductively coupled to the third coil 34. The positional relation between the first coil 30 and the third coil 34 is not particularly limited as long as the first coil 30 and the third coil 34 can be inductively coupled to each other.

At least a part of the third coil 34 overlaps the second coil 33 in the Z direction. The third coil 34 can be inductively coupled to the second coil 33. The positional relation between the third coil 34 and the second coil 33 is not particularly limited as long as the third coil 34 and the second coil 33 can be inductively coupled to each other.

The shape of the first coil 30 can be a quadrangular frame shape or an annular shape. The shape of the second coil 33 can be a quadrangular frame shape or an annular shape. The shape of the third coil 34 can be a quadrangular frame shape or an annular shape. The shape of the first coil 30 is preferably the same as the shape of the third coil 34. The shape of the third coil 34 is preferably the same as the shape of the second coil 33.

The length D1 of the first coil 30 in the X direction is not particularly limited. Similarly, the length D3 of the first coil 30 in the Y direction is not particularly limited. The length D3 of the first coil 30 in the Y direction is preferably equal to the length D1 of the first coil 30 in the X direction. The length D1 of the first coil 30 in the X direction is preferably longer than a distance H2 in the Z direction between the first coil 30 and the third coil 34. The length D3 of the first coil 30 in the Y direction is preferably longer than the distance H2 in the Z direction between the first coil 30 and the third coil 34.

The length D2 of the second coil 33 in the X direction is not particularly limited. Similarly, the length D4 of the second coil 33 in the Y direction is not particularly limited. The length D4 of the second coil 33 in the Y direction is preferably equal to the length D2 of the second coil 33 in the X direction. The length D2 of the second coil 33 in the X direction is preferably longer than a distance H3 in the Z direction between the third coil 34 and the second coil 33. The length D4 of the second coil 33 in the Y direction is preferably longer than the distance H3 in the Z direction between the third coil 34 and the second coil 33.

A length D5 of the third coil 34 in the X direction is not particularly limited. Similarly, a length D6 of the third coil 34 in the Y direction is not particularly limited. The length D6 of the third coil 34 in the Y direction is preferably equal to the length D5 of the third coil 34 in the X direction. The length D5 of the third coil 34 in the X direction is preferably longer than the distance H2 in the Z direction between the first coil 30 and the third coil 34. The length D6 of the third coil 34 in the Y direction is preferably longer than the distance H2 in the Z direction between the first coil 30 and the third coil 34. The length D5 of the third coil 34 in the X direction is preferably longer than the distance H3 in the Z direction between the third coil 34 and the second coil 33. The length D6 of the third coil 34 in the Y direction is preferably longer than the distance H3 in the Z direction between the third coil 34 and the second coil 33.

The fourth embodiment is described above. The semiconductor device 1D can be produced by a known manufacturing method. In the semiconductor device 1D according to the fourth embodiment, power saving can be achieved by transmitting a signal between the first coil 30 and the third coil 34, and between the third coil 34 and the second coil 33 by using inductive coupling. Since the wiring used for transmitting data signals and the like can be omitted, design restrictions on arrangement of the external connection pads are reduced. Accordingly, the size of the semiconductor device 1D can be reduced. The semiconductor device 1D includes a plurality of array chips. Thus, the storage capacity can be made larger than that of the semiconductor device 1. The semiconductor device 1D includes the third coil 34. Thus, even when a large number of array chips are provided, the signal can be transmitted between the first coil 30 and the second coil 33.

In the fourth embodiment, one example in which the number of the third coil 34 is one is described, but the number of the third coil 34 may be two or more.

ADDITIONAL EXAMPLES

Hereinafter, certain additional examples relating to arrangement of the first coil 30 will be described. The second coil 33 is disposed at a position where the second coil 33 can be inductively coupled to the first coil 30. The described example arrangements of the first coil 30 and the second coil 33 are non-limiting.

First Example

Figure 15:
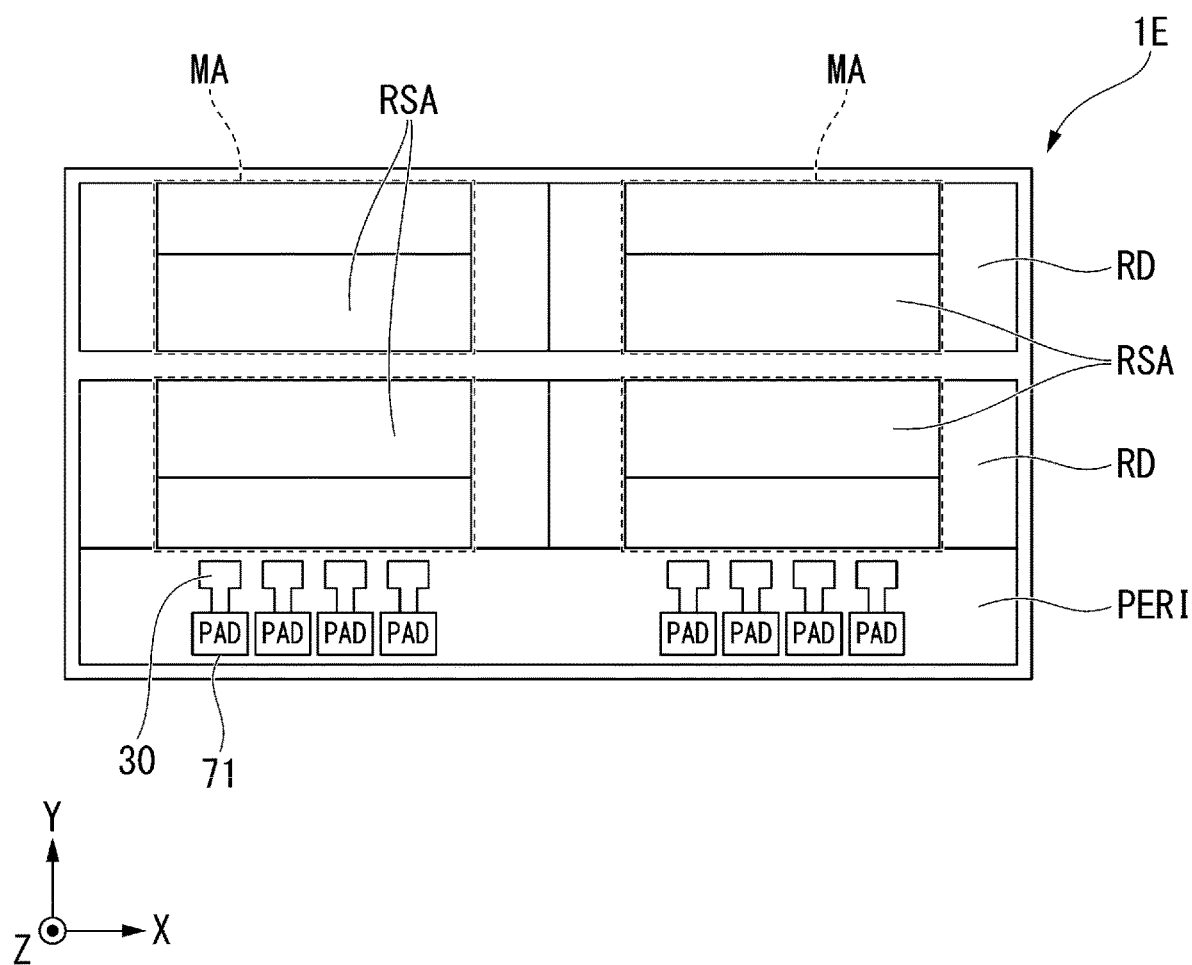
FIG. 15 is a plan view showing a positional relation of first coils of a first example of one embodiment.

FIG. 15 is a plan view showing an example of the arrangement of first coils 30. A sense amplifier region RSA is a region in the circuit chip 200 where the sense amplifier module 16 is provided. A row decoder region RD is a region in the circuit chip 200 where the row decoder 15 is provided. A peripheral circuit region PERI is a region in the circuit chip 200 where the sequencer 13 and the like are provided. A memory region MA is a region in the stacked body 110 where the memory cell array 10 is provided. The memory region MA includes the sense amplifier region RSA.

In a semiconductor device 1E, a plurality of first coils 30 and a plurality of first external connection pads 71 are provided in the peripheral circuit region PERI.

The semiconductor device 1E can transmit a signal between the first coils 30 and the second coils 33 by using inductive coupling.

Second Example

Figure 16:
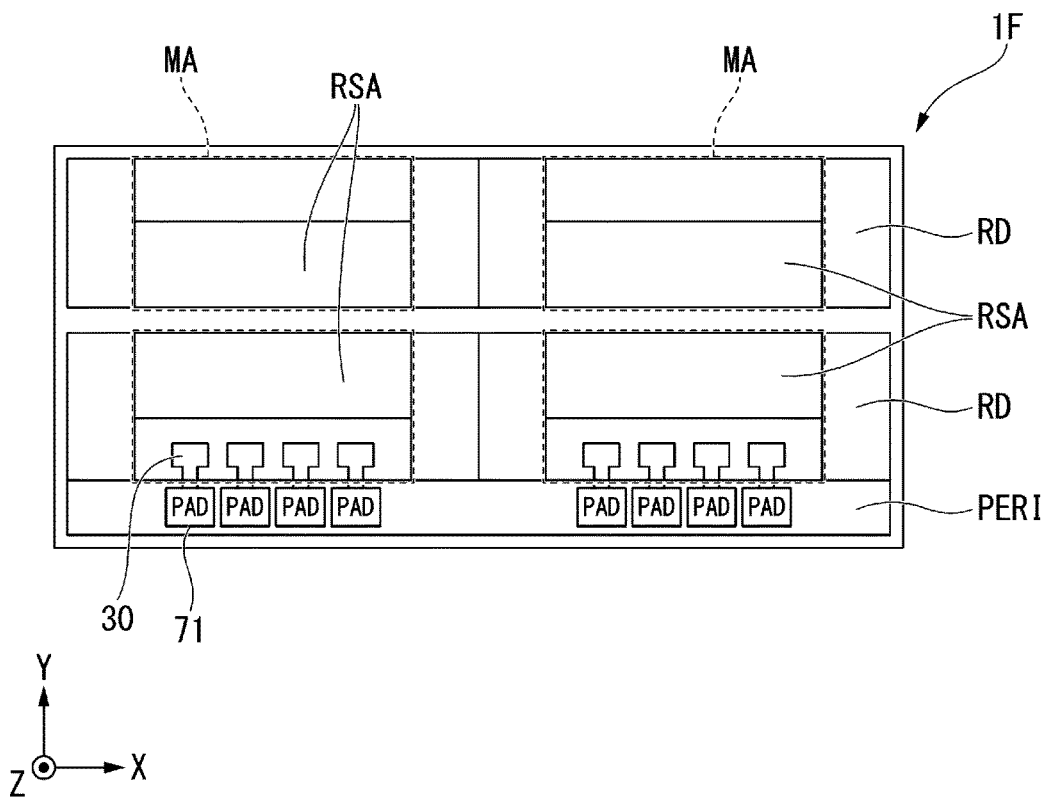
FIG. 16 is a plan view showing a positional relation of first coils of a second example of the embodiment.

FIG. 16 is a plan view showing another example of the arrangement of first coils 30. In a semiconductor device 1F, a plurality of first external connection pads 71 are provided in the peripheral circuit region PERI. The first coils 30 are provided in the memory region MA. The memory region MA includes the sense amplifier region RSA.

Similar to the semiconductor device 1E, the semiconductor device 1F can transmit a signal between the first coils 30 and the second coils 33 by using inductive coupling.

Third Example

Figure 17:
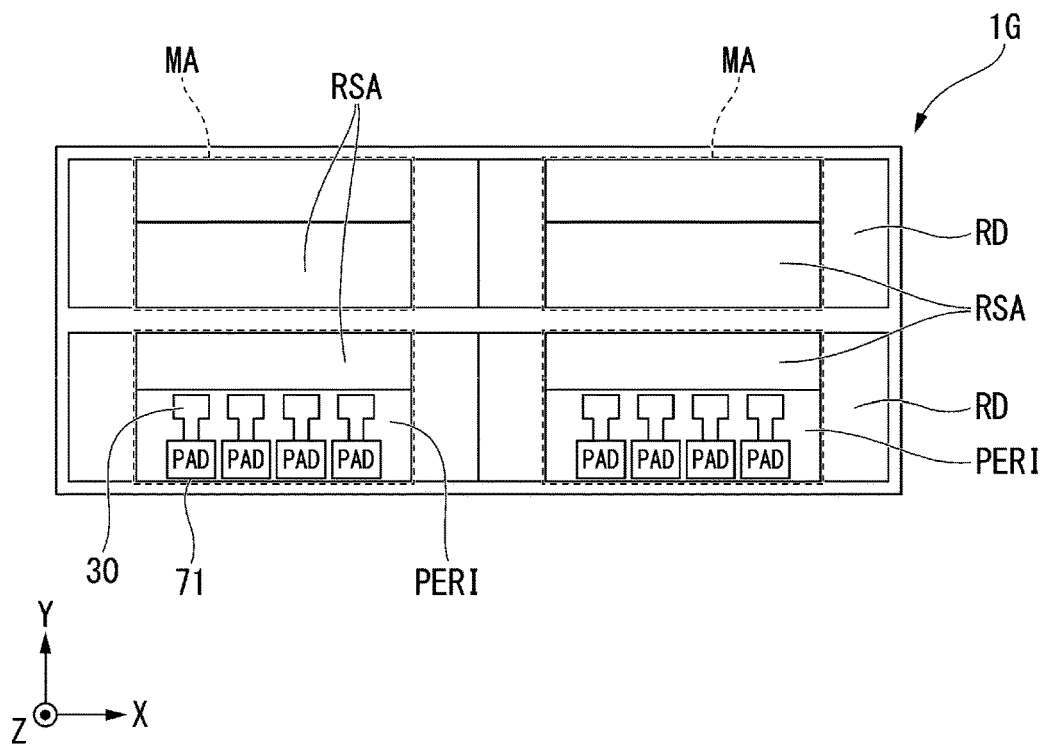
FIG. 17 is a plan view showing a positional relation of first coils of a third example of the embodiment.

FIG. 17 is a plan view showing yet another example of the arrangement of first coils 30. In a semiconductor device 1G, a plurality of first external connection pads 71 and a plurality of first coils 30 are provided in the peripheral circuit region PERI. A plurality of external connection pads 71 and a plurality of first coils 30 are further provided in the memory region MA. The memory region MA includes the sense amplifier region RSA and the peripheral circuit region PERI.

Similar to the semiconductor device 1E, the semiconductor device 1G can transmit a signal between the first coils 30 and the second coils 33 by using inductive coupling. The size of the semiconductor device 1G is smaller than the sizes of the semiconductor device 1E and the semiconductor device 1F.

According to at least one embodiment described above, the semiconductor device includes a first substrate, a first external connection pad, a first coil, a first stacked body, and a second stacked body. The first external connection pad is provided separated from the first substrate in a first direction, which is a thickness direction of the first substrate. The first coil is provided separated from the first substrate in the first direction. The first coil is electrically connected to the first external connection pad. The first stacked body is provided between the first external connection pad and the first substrate, and between the first coil and the first substrate. The first stacked body includes a first insulator, a first wiring provided in the first insulator, and a first pad electrically connected to the first wiring. The second stacked body is provided between the first stacked body and the first substrate. The second stacked body includes a second insulator, a second wiring provided in the second insulator, a second pad electrically connected to the second wiring, and a second coil. The first insulator is in contact with the second insulator. The first pad is joined to the second pad. At least a part of the first coil overlaps the second coil in the first direction. According to such a configuration, it is possible to improve electrical characteristics.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a substrate;
   a first external connection pad separated from the substrate in a first direction, which is a thickness direction of the substrate;
   a first coil separated from the substrate in the first direction and electrically connected to the first external connection pad;
   a first stacked body between the first external connection pad and the substrate and between the first coil and the substrate, the first stacked body including a first insulator, a first wiring in the first insulator, and a first pad electrically connected to the first wiring; and
   a second stacked body between the first stacked body and the substrate, the second stacked body including a second insulator, a second wiring in the second insulator, a second pad electrically connected to the second wiring, and a second coil, wherein
   the first insulator is in contact with the second insulator,
   the first pad is in contact with the second pad, and
   at least a part of the first coil overlaps the second coil in the first direction.

2. The semiconductor device according to claim 1, wherein the second coil is closer to the substrate than a contact surface between the first and second pads in the first direction.

3. The semiconductor device according to claim 1, further comprising:
   a third stacked body between the first external connection pad and the first stacked body and between the first coil and the first stacked body, the third stacked body including a third insulator, a third wiring provided in the third insulator, and a third pad electrically connected to the third wiring, wherein
   the first stacked body further includes a fourth pad electrically connected to the first wiring and in contact with the third pad, and
   the first insulator is in contact with the third insulator.

4. The semiconductor device according to claim 1, further comprising:
   a third coil between the first and second coils in the first direction, wherein
   at least a part of the first coil overlaps the third coil in the first direction, and at least a part of the third coil overlaps the second coil in the first direction.

5. The semiconductor device according to claim 1, further comprising:
   an inverter separated from the substrate in the first direction and electrically connected between the first external connection pad and the first coil.

6. The semiconductor device according to claim 1, comprising:
   a second external connection pad separated from the substrate in the first direction and to which power from an external power supply or a reference voltage can be applied, wherein
   the first stacked body further includes a first power supply wiring electrically connected to the second external connection pad and extending in the first insulator along the first direction, and a first power supply pad electrically connected to the first power supply wiring, and
   the second stacked body further includes a second power supply pad in contact with the first power supply pad.

7. The semiconductor device according to claim 1, wherein a signal which can be input to the first coil is at least one of a data signal, a control signal, and a data strobe signal.

8. The semiconductor device according to claim 1, wherein the second pad is electrically connected to a row decoder.

9. The semiconductor device according to claim 1, wherein the second pad is electrically connected to a sense amplifier module.

10. The semiconductor device according to claim 1, wherein the first coil has the same shape as the second coil.

11. The semiconductor device according to claim 1, wherein a length of each of the first and second coils in a second direction perpendicular to the first direction is greater than a distance between the first and second coils in the first direction.

12. The semiconductor device according to claim 1, wherein the first stacked body includes a memory cell array above a first region, and
the substrate and the second stacked body make up a circuit chip including:
a sense amplifier module in a second region included in the first region,
a row decoder in a third region adjacent to the first region in a second direction perpendicular to the first direction, and
a sequencer in a fourth region adjacent to the first and third regions in a third direction perpendicular to the second direction.

13. The semiconductor device according to claim 12, wherein the first external connection pad and the first coil are each disposed at a position corresponding to the fourth region.

14. The semiconductor device according to claim 12, wherein the first external connection pad is disposed at a position corresponding to the fourth region, and the first coil is disposed at a position corresponding to the first region.

15. The semiconductor device according to claim 1, wherein the first stacked body includes a memory cell array above a first region,
the substrate and the second stacked body make up a circuit chip including:
a sense amplifier module in a second region included in the first region,
a row decoder in a third region adjacent to the first region in a second direction perpendicular to the first direction, and
a sequencer in a fourth region included in the first region, and
the first external connection pad and the first coil are each disposed at a position corresponding to the fourth region.

16. A semiconductor device, comprising:
a substrate;
a first external connection pad separated from the substrate in a first direction, which is a thickness direction of the substrate;
a first coil separated from the substrate in the first direction and electrically connected to the first external connection pad;
a first stacked body between the first external connection pad and the substrate and between the first coil and the substrate, the first stacked body including a first insulator, a first wiring in the first insulator, and a first pad electrically connected to the first wiring; and
a second stacked body between the first stacked body and the substrate, the second stacked body including a second insulator, a second wiring in the second insulator, a second pad electrically connected to the second wiring, and a second coil, wherein
the first insulator is in contact with the second insulator,
the first pad is in contact with the second pad, and
the first coil is inductively couplable to the second coil.

17. The semiconductor device according to claim 16, wherein the second coil is closer to the substrate than a contact surface between the first and second pads in the first direction.

18. The semiconductor device according to claim 16, further comprising:
a third stacked body between the first external connection pad and the first stacked body and between the first coil and the first stacked body, the third stacked body including a third insulator, a third wiring provided in the third insulator, and a third pad electrically connected to the third wiring, wherein
the first stacked body further includes a fourth pad electrically connected to the first wiring and in contact with the third pad, and
the first insulator is in contact with the third insulator.

19. The semiconductor device according to claim 16, further comprising:
a third coil between the first and second coils in the first direction, wherein
the third coil is inductively couplable to the first and second coils.

20. A semiconductor device, comprising:
an array chip including a memory cell array; and
a circuit chip disposed on the array chip along a first direction and including a control circuit configured to control the memory cell array, wherein
the array chip includes a first surface that contacts the circuit chip and a second surface opposite to the first surface,
the array chip further includes:
a first external connection pad and a first coil along the second surface,
a first insulator,
a first wiring in the first insulator, and
a first pad electrically connected to the first wiring, and
the circuit chip includes:
a second insulator that contacts the first insulator,
a second wiring in the second insulator,
a second pad electrically connected to the second wiring and contacting the first pad, and
a second coil, at least part of which overlaps the first coil in the first direction.

* * * * *